United States Patent
Riho et al.

(10) Patent No.: US 7,248,528 B2
(45) Date of Patent: Jul. 24, 2007

(54) REFRESH CONTROL METHOD OF A SEMICONDUCTOR MEMORY DEVICE AND SEMICONDUCTOR MEMORY DEVICE

(75) Inventors: Yoshiro Riho, Tokyo (JP); Kazuhiko Kajigaya, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 11/254,722

(22) Filed: Oct. 21, 2005

(65) Prior Publication Data
US 2006/0087903 A1   Apr. 27, 2006

(30) Foreign Application Priority Data
Oct. 21, 2004   (JP)   ............................ 2004-307469
Nov. 11, 2004   (JP)   ............................ 2004-328290

(51) Int. Cl.
*G11C 7/00*   (2006.01)

(52) U.S. Cl. .................................. 365/222; 365/230.06

(58) Field of Classification Search ................. 365/222
See application file for complete search history.

(56) References Cited

U.S. PATENT DOCUMENTS 6,449,203 B1 *  9/2002  Cowles et al. .............. 365/222
6,449,204 B1 *  9/2002  Arimoto et al. ............ 365/222
6,714,476 B2 *  3/2004  Hsu et al. .............. 365/230.03
6,850,449 B2 *  2/2005  Takahashi .................... 365/222

FOREIGN PATENT DOCUMENTS

JP   2004-118938 A   4/2004

* cited by examiner

*Primary Examiner*—Son L. Mai
(74) *Attorney, Agent, or Firm*—McDermott Will & Emery LLP

(57) ABSTRACT

A refresh control method of a semiconductor memory device which controls a self-refresh operation to hold data in a memory array having a plurality of memory cells disposed at intersections of word lines corresponding to row addresses and bit lines corresponding to column addresses, comprising: a step for dividing the memory array into a holding area used as a copy source which includes memory cells on a predetermined number of word lines, and a copy area used as a copy destination which includes memory cells on word lines to which entire data of the holding area is to be copied, a step for executing copy operation in which data of each memory cell of the holding area is copied to one or more memory cells in the copy area on the same bit line or the same pair of bit lines before executing the self-refresh operation, and a step for executing the self-refresh operation in which a row address of the holding area is designated and a corresponding word line is selected and driven, and at the same time, one or more word lines in the copy area corresponding to the selected word line are selected and driven.

28 Claims, 33 Drawing Sheets

FIG.8

X8 switch unit:control contents

|  | switch SW1 | switch SW2 | switch SW3 |
|---|---|---|---|
| normal operation | ON | OFF | OFF |
| burst copy | OFF | ON | OFF |
| self-refresh | OFF | OFF | ON |

FIG.11A  control contents for each of the data holding capacities

| Data holding capacity | Switch unit to be controlled | Switch unit to be fixed |
|---|---|---|
| 256 Mbits (1 memory cell / 1 bit) | – | X8 X7 X6 X5 |
| 128 Mbits (2 memory cells / 1 bit) | X8 | X7 X6 X5 |
| 64 Mbits (4 memory cells / 1 bit) | X8 X7 | X6 X5 |
| 32 Mbits (8 memory cells / 1 bit) | X8 X7 X6 | X5 |
| 16 Mbits (16 memory cells / 1 bit) | X8 X7 X6 X5 | – |

FIG.11B  control contents of switches to be controlled

|  | switch SW1 | switch SW2 | switch SW3 |
|---|---|---|---|
| normal operation | ON | OFF | OFF |
| burst copy | OFF | ON | OFF |
| self-refresh | OFF | OFF | ON |

FIG.11C  control contents of switches to be fixed

|  | switch SW1 | switch SW2 | switch SW3 |
|---|---|---|---|
| (always) | ON | OFF | OFF |

FIG.13

| data holding capacity | total number of word lines of the holding area | number of memory cells per 1 bit | accumulated charge amount per 1 bit |
|---|---|---|---|
| 256 Mbits (no PASR) | 8192 | 1 memory cell / 1 bit | q0 |
| 128 Mbits (1/2) | 4096 | 2 memory cells / 1 bit | 2q0 |
| 64 Mbits (1/4) | 2048 | 4 memory cells / 1 bit | 4q0 |
| 32 Mbits (1/8) | 1024 | 8 memory cells / 1 bit | 8q0 |
| 16 Mbits (1/16) | 512 | 16 memory cells / 1 bit | 16q0 | refresh period : 1ms refresh period : 50s refresh period : 100s refresh period : 200s

FIG.21 control contents of the control registers

| Data holding capacity | control register in the ON state | control registers in the OFF state |
|---|---|---|
| 256 Mbits (1 memory cell / 1 bit) | – | Ra Rb Rc Rd |
| 128 Mbits (2 memory cells / 1 bit) | Ra | Rb Rc Rd |
| 64 Mbits (4 memory cells / 1 bit) | Rb | Ra Rc Rd |
| 32 Mbits (8 memory cells / 1 bit) | Rc | Ra Rb Rd |
| 16Mbits (16 memory cells / 1 bit) | Rd | Ra Rb Rc |

FIG.32

| data holding capacity | refresh period | refresh operation current | power supply is not controlled | | power supply is controlled | |
|---|---|---|---|---|---|---|
| | | | power supply circuit current | self-refresh current | power supply circuit current | self-refresh current |
| 256 Mbits | 0.1sec | 415μA | 20μA | 435μA | 5μA | 420μA |
| 128 Mbits | 0.2sec | 105μA | 20μA | 125μA | 5μA | 110μA |
| 64 Mbits | 1.0sec | 10μA | 20μA | 30μA | 5μA | 15μA |
| 32 Mbits | 4.0sec | 1μA | 20μA | 21μA | 5μA | 6μA |
| 16 Mbits | 8.0sec | less than 0.5μA | 20μA | 20μA | 5μA | 5μA |

REFRESH CONTROL METHOD OF A SEMICONDUCTOR MEMORY DEVICE AND SEMICONDUCTOR MEMORY DEVICE

BACKGROUND OF THE INVENTION

1. Field of the Invention

The present invention relates to a field of refresh technique for a pseudo SRAM or a DRAM (Dynamic Random Access Memory) mounted on a mobile device, and more particularly, to a partial array self-refresh type technical field only for a partial area which is set in a memory array in long period refresh operation for reducing power consumption as compared with normal state.

2. Related Art

In recent years, a large-capacity DRAM is mounted in a mobile device such as a cellular phone in general. To reduce the power consumption when the mobile device is in a standby mode, it is strongly desired to reduce the consumption current in a data holding state of the DRAM. To that end, there has been developed a DRAM having long period refresh function for executing self-refresh operation for sufficiently long period as compared with normal operation.

In long period refresh, as an effective technique for further reducing the power consumption, a partial array self-refresh method is proposed (e.g., see Japanese Patent Application Laid-open No. 2004-118938). According to the partial array self-refresh method, in a memory array which generally comprises a plurality of banks, a self-refresh operation is selectively executed for one or some of the banks. In this case, one or some of the banks are set as a holding area, data which must be held are stored in the holding area and in this state, the long period refresh operation may be executed only for the portion corresponding to the holding area. For example, in a partial array self-refresh method in which two of four banks are used as the holding area, since the area to be refreshed is reduced in half as compared with normal refresh operation, and this method is effective for reducing the current consumption of the DRAM.

However, when it is desired to increase the battery using time of the mobile device, the current consumption can not be reduced sufficiently even if the conventional partial array self-refresh method is employed.

Especially as multi-function tendency of the mobile device is increased, the tendency of mounting the large-capacity DRAM is increased, and it is desired to further reduce the current consumption in the self-refresh operation. According to the partial array self-refresh method, if the number of banks in which data is held is reduced, it is possible to reduce the current consumption correspondingly as described above. However, in terms of the ease-of-use of the mobile device, it is necessary to secure the data-holding capacity to a certain extent, and there is a limit of reduction of current consumption of the DRAM in the standby mode.

Moreover, there is a known technique in which power supply is suspended at predetermined timing by controlling predetermined supply voltage which is to be supplied to an array circuit including memory arrays or a peripheral circuit in the self-refresh operation, thereby reducing the current consumption of the DRAM. It is possible to apply this method to the partial array method. In this case, however, of the current flowing in the self-refresh operation, current which can be reduced by suspending the power supply is only supply circuit current (not dynamic operation current, but current corresponding to DC current), and it is necessary to maintain the refresh operation current which is required for the self-refresh operation. Normally, most of current which flows at the time of self-refresh is the refresh operation current, and thus even if the supply circuit current is reduced, sufficient current reducing effect can not be obtained as a whole.

BRIEF SUMMARY OF THE INVENTION

It is an object of the invention to make it possible to realize a self-refresh control method of a semiconductor memory device capable of further increasing the refresh period, and capable of largely reducing current consumption of a DRAM when it is in a standby mode when a holding area for holding data is limited and a self-refresh operation is executed.

An aspect of the present invention is a refresh control method of a semiconductor memory device which controls a self-refresh operation to hold data in a memory array having a plurality of memory cells disposed at intersections of word lines corresponding to row addresses and bit lines corresponding to column addresses, comprising: a step for dividing said memory array into a holding area used as a copy source which includes memory cells on a predetermined number of word lines, and a copy area used as a copy destination which includes memory cells on word lines to which entire data of said holding area is to be copied, a step for executing copy operation in which data of each memory cell of said holding area is copied to one or more memory cells in said copy area on the same bit line or the same pair of bit lines before executing said self-refresh operation, and a step for executing said self-refresh operation in which a row address of said holding area is designated and a corresponding word line is selected and driven, and at the same time, one or more word lines in said copy area corresponding to said selected word line are selected and driven.

According to the aspect of the invention, data is held only in a holding area which is a portion of the entire memory array, and other area is used as a copy area for copying data in the holding area. First, copy operation from the holding area to the copy area is executed and then, word lines of the memory cells corresponding to the holding area and the copy area are simultaneously selected and driven to execute the self-refresh operation. At that time, one of memory cells from which data is copied is disposed on the same bit line (or a pair of same bit lines) as a predetermined number of memory cells to which data is copied. Therefore, it is possible to reliably execute the copy operation and the self-refresh operation by appropriately controlling the driving timing of the word line. When the self-refresh is executed, the storage capacity of the holding area where data is to be held is reduced, one-bit data is held in a plurality of memory cells, thereby increasing the accumulated charge. Further, if the probability that the data is destroyed is reduced, refresh of longer period can be realized, and the current consumption when semiconductor memory device is in a standby state can largely be reduced.

In the method of the present invention, in said copy operation, a row address of said holding area may be designated and a corresponding word line may be selected and driven, and after a predetermined time is elapsed, one or more word lines in said copy area corresponding to said selected word line may be selected and driven.

In the method of the present invention, said holding area may have a capacity which can be switched in a plurality of stages, and the number of memory cells of said copy destination corresponding to one bit of said copy source can be selectively changed in accordance with each said capacity.

In the method of the present invention, said capacity of said holding area can be switched in M stages of $1/2^N$ (N is an integer of 1 or more and M or less) of the entire memory array, and data of one memory cell of said copy destination may be copied to $2^N-1$ memory cells of said copy source.

In the method of the present invention, in said copy operation and said self-refresh operation, said holding area and plurality of said copy areas may be discriminated based on M-bit predetermined pattern of a portion of said row address.

In the method of the present invention, a first mode in which data only in said holding area is held and a second mode in which data in the entire memory array is held can be selectively set.

The method of the present invention may further comprises a step in which when said self-refresh operation is suspended, whether an arbitrary word line is accessed for the first time or second or more time after exit of said self-refresh operation is discriminated, and a step for simultaneously driving a word line to be accessed and one or more word lines in which the same data is held by said copy operation when said discrimination result shows an access for the first time, and driving only said word line to be accessed after shifting to normal operation when said discrimination result shows an access for the second or more time.

The method of the present invention may further comprises a step in which when said self-refresh operation is suspended, a row address of said holding area is designated and a corresponding word line is selected and driven, at the same time, one or more word lines in said copy area corresponding to said selected word line are selected and driven, and shifting to a normal operation is performed after all of the word lines in said holding area and said copy area are driven.

The method of the present invention may further comprises a step for controlling switching of power supply of said semiconductor memory device such that supply voltages of said power supply are supplied or suspended in accordance with the state of said self-refresh operation.

In the method of the present invention, said power supply may include an array power supply for an array circuit and a peripheral power supply for a peripheral circuit, and switching of said peripheral power supply may be controlled such that supply of at least one voltage to a portion of said peripheral circuit is suspended during said self-refresh operation, and switching of said array power supply is controlled such that power-down or power-up of at least one voltage to said array circuit is repeatedly performed in a predetermined period during said self-refresh operation.

In the method of the present invention, in said self-refresh, burst refresh for controlling such that all of the word lines in said holding area are collectively selected at predetermined timing during a refresh period may be executed, and switching of said array power supply may be controlled such that said power-up is performed during an operation period of said burst refresh and said power-down is performed during suspension period of said burst refresh.

In the method of the present invention, said holding area may have a capacity which can be switched in a plurality of stages, and the number of memory cells of said copy destination corresponding to one bit of said copy source can be selectively changed in accordance with each said capacity.

In the method of the present invention, switching control of said power supply may be performed when said capacity of said holding area which is set to any of said plurality of stages is not greater than a preset capacity, and switching control of said power supply is not performed when said capacity of said holding area is set to any of other stage.

In the method of the present invention, presence or the absence of said power supply control can selectively be set, and in said self-refresh, switching control of said power supply is performed when the presence of said power supply control is set, and said switching control of said power supply is not performed when the absence of said power supply control is set.

An aspect of the present invention is a semiconductor memory device comprising: a memory array having a plurality of memory cells disposed at intersections of word lines corresponding to row addresses and bit lines corresponding to column addresses, self-refresh control means for controlling a self-refresh operation in which said memory array is divided into a holding area used as a copy source which includes memory cells on a predetermined number of word lines and a copy area used as a copy destination which includes memory cells on word lines to which entire data of said holding area is to be copied, and a row address of said holding area is designated sequentially to hold data in said self-refresh operation, word line selecting and driving means for selecting and driving a word line in said holding area designated by said self-refresh control means, and for selecting and driving one or more word lines in said copy area corresponding to said selected word line after a predetermined time is elapsed.

The device of the present invention may further comprises a setting register capable of selectively switching a plurality of stages as a capacity of said holding area, wherein the number of memory cells of said copy destination corresponding to one bit of said copy source may be discriminated in accordance with contents of said setting register.

In the device of the present invention, a first mode in which data only in said holding area is held and a second mode in which data in the entire memory array is held can be selectively set in said setting register.

In the device of the present invention, said capacity of said holding area can be switched in M stages of $1/2^N$ (N is an integer of 1 or more and M or less) of the entire memory array, and said word line selecting and driving means selects and drives a plurality of memory cells of said copy destination corresponding to different M bit patterns of a portion of said row address The device of the present invention may further comprises discriminating means in which when said self-refresh operation is suspended, whether an arbitrary word line is accessed for the first time or second or more time after exit of said self-refresh operation is discriminated, wherein said word line selecting and driving means simultaneously drives a word line to be accessed and one or more word lines in which the same data is held by said copy operation when said discrimination result shows an access for the first time, and drives only said word line to be accessed after shifting to a normal operation when said discrimination result shows an access for the second or more time.

In the device of the present invention, said memory array may be divided into a plurality of blocks, in each of which word lines and bit lines are common, and said holding area and said copy area may consist of a combination of said blocks.

In the device of the present invention, wherein said memory cell is connected to one or the other of a pair of bit lines connected to a common sense amplifier, and the same number of memory cells among memory cells of said copy source and said copy destination on the same pair of bit lines are connected to one and the other of said pair of bit lines.

An aspect of the present invention is a semiconductor memory device comprising: an array circuit having a plurality of memory cells disposed at intersections of word lines corresponding to row addresses and bit lines corresponding to column addresses, a peripheral circuit including control means for controlling operation of said array circuit, voltage generating means for generating at least one array voltage of an array power supply to be supplied to said array circuit and at least one peripheral voltage of a peripheral power supply to be supplied to said peripheral circuit, self-refresh control means for controlling a self-refresh operation in which said memory array is divided into a holding area used as a copy source which includes memory cells on a predetermined number of word lines and a copy area used as a copy destination which includes memory cells on word lines to which entire data of said holding area is to be copied, copy operation in which data of each memory cell of said holding area is copied to one or more memory cells in said copy area on the same bit line or the same pair of bit lines is executed, and said self-refresh operation in which a row address of said holding area is designated and a corresponding word line is selected and driven, and at the same time, one or more word lines in said copy area corresponding to said selected word line are selected and driven is executed, and power supply control means for controlling switching of said array power supply and said peripheral power supply such that supply or suspension of said array voltage and said peripheral voltage is switched in accordance with a state of said self-refresh operation.

In the device of the present invention, said self-refresh control means may designate a row address of said holding area, select and drive a corresponding word line, and select and drive one or more word lines in said copy area corresponding to said selected word line after a predetermined time is elapsed.

In the device of the present invention, said power supply control means may control switching such that supply of said at least one peripheral voltage to a portion of said peripheral circuit is suspended during said self-refresh operation, and power-down or power-up of said at least one array voltage to said array circuit is repeatedly performed in a predetermined period during said self-refresh operation.

In the device of the present invention, said self-refresh control means may execute burst refresh in which all of the word lines in said holding area are collectively selected at predetermined timing during a refresh period, and said power supply control means may control such that supply of said array voltage is performed during an operation period of said burst refresh and suspension of said array voltage during suspension period of said burst refresh.

The device of the present invention may further comprises a setting register capable of selectively switching a plurality of stages as a capacity of said holding area, wherein the number of memory cells of said copy destination corresponding to one bit of said copy source may be discriminated in accordance with contents of said setting register.

In the device of the present invention, said power supply control means controls switching of said power supply when said capacity of said holding area is set to stages which are equal to or lower than preset capacity, and does not controls switching of said power supply when said capacity of said holding area is set to other stages.

In the device of the present invention, presence or absence of control of said power supply control means can be selectively set in said setting register, and when said self-refresh is executed, the presence or absence of control of said power supply control means can be selected in accordance with contents of said setting register.

As described above, according to the present invention, the subject of the self-refresh is limited to the data holding area which is set in a portion of the memory array, data is copied from the data holding area to a portion of the copy area or the plurality of memory cells on the same bit line or the same pair of bit lines, and a word line from which data is copied and a word line to which the data is copied are selected and driven at the same time when the self-refresh is executed. Therefore, longer period refresh can be realized, and the current consumption of the semiconductor memory device at the time of self-refresh can largely be reduced. That is, the size of the holding area itself can be reduced, and since the same data is held in the plurality of memory cells, the accumulated charge is increased. Thereby effect, the refresh period can remarkably be increased and the current consumption can be reduced correspondingly.

And according to the present invention, since the switching control of the supply voltage is combined in the self-refresh operation, the current consumption can further be reduced. Thus, the refresh period can remarkably be increased and the current consumption can largely be reduced by this effect and the control effect of the supply voltage in the self-refresh operation.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 8 is a diagram showing control contents of the X8 switch unit in each operation state in the circuit configuration in FIG. 7;

FIGS. 11A, 11B and 11C are diagrams showing control contents with respect to the four (X5 to X8) switch units for each of the data holding capacities;

FIG. 13 is a diagram collectively showing a relation between the data holding capacity which can selectively be set in accordance with configuration of the first embodiment and the operation state of the self-refresh;

FIG. 21 is a diagram showing control contents of control registers in the circuit configuration in FIG. 21;

FIG. 32 is a graph showing variation in current in accordance with the presence or absence of the power supply control when the data holding capacity is varied in the second embodiment.

DETAILED DESCRIPTION OF THE INVENTION

Embodiments of the present invention will be explained below with reference to the drawings. In the embodiments, the invention is applied to a DRAM having a configuration capable of executing a long period refresh operation for reducing power consumption.

First Embodiment

Figure 1:
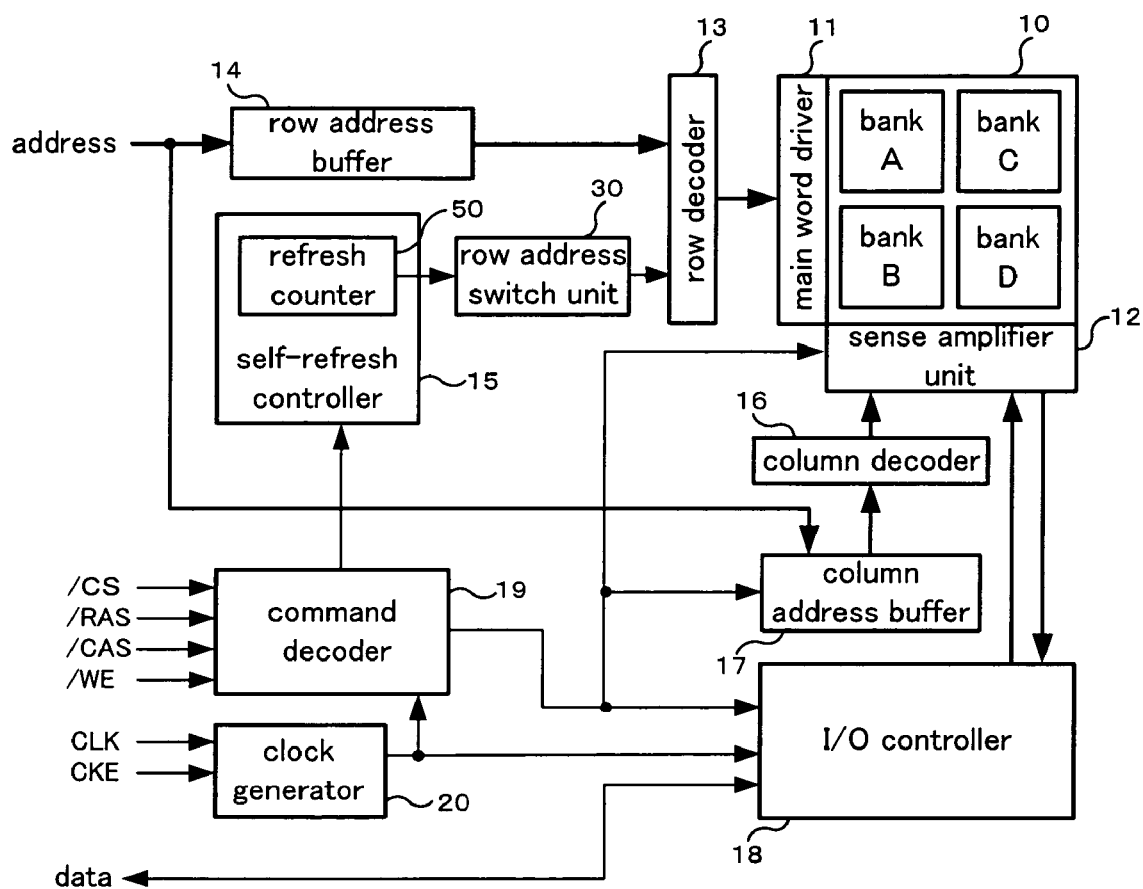
FIG. 1 is a block diagram showing the entire configuration of the DRAM of the first embodiment.

FIG. 1 is a block diagram showing the entire configuration of a DRAM of a first embodiment. In this example, the DRAM has storage capacity of 256 Mbits, and four banks. The DRAM shown in FIG. 1 has a memory array 10 in which a large number of memory cells are arranged in a matrix form in a direction of rows and in a direction of columns. Each memory cell stores 1 bit. The memory array 10 is divided into four banks which are 64 Mbits storage regions (these banks are shown as banks A, B, C and D in the drawing). These banks have the same configuration. Each bank is designated based on a bank selection signal of 2 bits coming with an address signal.

Provided around the memory array 10 are a main word driver 11, a sense amplifier unit 12, a row decoder 13, a row address buffer 14, a self-refresh controller 15, a column decoder 16, a column address buffer 17, an I/O controller 18, a command decoder 19 and a clock generator 20. Further, a row address switch unit 30 for realizing partial array self-refresh of the first embodiment is also provided around the memory array 10. Address signals and various control signals are supplied to the memory array 10, and data to be stored in the memory array 10 is input to and output from the memory array 10.

A row address or a column address in the memory array 10 which is to be accessed is designated by an address signal which is supplied from outside the address signal. A row address designated by the address signal is held in the row address buffer 14, and a column address designated by the address signal is held in the column address buffer 17. The row decoder 13 selects one word line corresponding to the designated row address. The column decoder 16 selects one bit line corresponding to the designated column address. Since the memory array 10 is divided into the banks, word lines corresponding to the row addresses includes the entire main word lines and divided sub-word lines.

If desired word line and bit line are selected by the row decoder 13 and the column decoder 16, a memory cell to be accessed is determined in the memory array 10. The main word driver 11 drives the word line selected by the row decoder 13 at a selection level. The sense amplifier unit 12 amplifies voltage difference corresponding to read data of a memory cell connected to a word line which is driven at the selection level. Data in the memory cell to be accessed is input to and output from outside through the I/O controller 18. That is, read data from the memory array 10 is output to outside by the I/O controller 18, and write data which is input from outside is sent to the memory array 10 through the I/O controller 18.

The command decoder 19 discriminates a control command defined based on a combination pattern of the control signals, and sends a control signal corresponding to the operation contents to various portions. Control signals to be input to the command decoder 19 from outside are a chip select signal (/CS), a row address strobe signal (/RAS), a column address strobe signal (/CAS) and a write enable signal (/WE) (symbol / means that the signal becomes active when low level). Various control commands are in association with these arbitrary combinations.

The clock generator 20 generates internal clock which controls the operation timings of the various constituent elements shown in FIG. 1 based on a clock signal CLK which is input from outside. The clock generator 20 determines effectiveness of the clock signal CLK by a clock enable signal CKE which is input from outside.

The self-refresh controller 15 controls the self-refresh operation in a data holding state of the DRAM. If the self-refresh operation is started in accordance with a predetermined control command, a refresh counter 50 is actuated. The refresh counter 50 generates row addresses sequentially. The refresh counter 50 counts up the row address based on output from an oscillator sequentially and sends them to the row decoder 13. The self-refresh operation will be explained in detail later.

The row address switch unit 30 is a circuit for switching a row address designated in the normal operation to a row address used in the partial array self-refresh. In the first embodiment, selection timings of the designation of the row address and selection of the word line are different in the normal operation, in later-described copy operation and in the self-refresh operation. Therefore, it is necessary to output an appropriate combination of row addresses in accordance with the operation state from the row address switch unit 30 to the row decoder 13 at a predetermined timing. Configuration and operation of the row address switch unit 30 will be described later.

In the first embodiment, as a concrete example of the memory array 10 of 256 Mbits, it is possible to employ a configuration in which input and output data has 16 bits, 13 bits of the address signal are allocated to the row address, 9 bits of the address signal are allocated to the column address. Thereby, in each of the banks designated by the bank selection signal of 2 bits a memory cell of 16 bits of any address can be designated among memory cells of 8192 rows×512 columns×16 bits.

Figure 2:
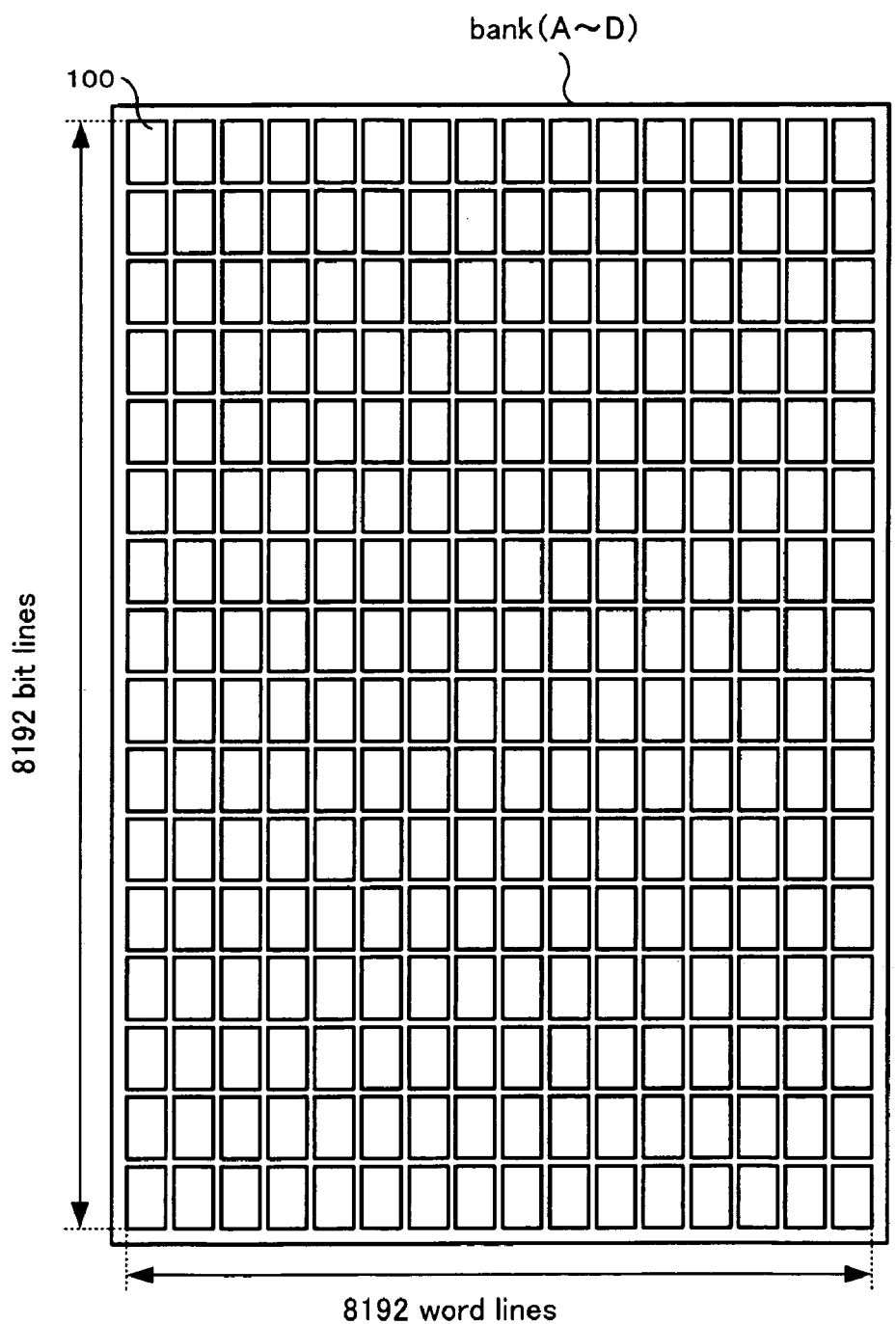
FIG. 2 is a concrete example of configuration of one bank constituting the memory array.

FIG. 2 shows a concrete example of configuration of one bank constituting the memory array 10. As shown in FIG. 2, the memory array 10 corresponding to the four banks A to D includes 8192 word lines and 8192 (512 columns×16 bits) pairs of bit lines, and the memory array 10 comprises 256 (16×16) MATs 100 obtained by dividing them. Each MAT 100 is located as a unit block in which word lines (sub-word lines) in each row and bit lines in each column in the memory array 10 are commonly used, and in different MATs 100, the word lines and bit lines are divided from each other. Sense amplifiers included in the sense amplifier unit 12 are disposed in each MAT 100.

Each MAT 100 includes 512×512 memory cells disposed at intersections of the word lines and the bit lines. To designate an arbitrary MAT 100 among the 256 MATs 100 in one bank, it is necessary to allocate 4 bits of the row address and 4 bits of the column address. In the first embodiment, since the later-described copy operation and the like are executed on the assumption that the bit lines are common, the MAT 100 is a basic processing unit.

Next, a conception of the partial array self-refresh of long period which is executed in the DRAM of the first embodiment will be explained using FIGS. 3 and 4. In the first embodiment, when an entry command to execute self-refresh which is one of control commands to the DRAM is input, a self-refresh operation with respect to the holding area which is set as an area where data is held among the entire memory array 10 is executed. The data capacity (data holding capacity) in the holding area in the memory array 10 can be set by previous setting of user. For example, of the entire 256 Mbits of the memory array 10, the data holding capacity can selectively be set such as 128 Mbits (½) and 64 Mbits (¼). In the first embodiment, of the memory array 10, other area which is different from the holding area is set as a copy area in which the entire data in the holding area is copied. Thus, data in the copy area need not be held, and if the self-refresh operation is executed, the original data is erased.

Figure 3:
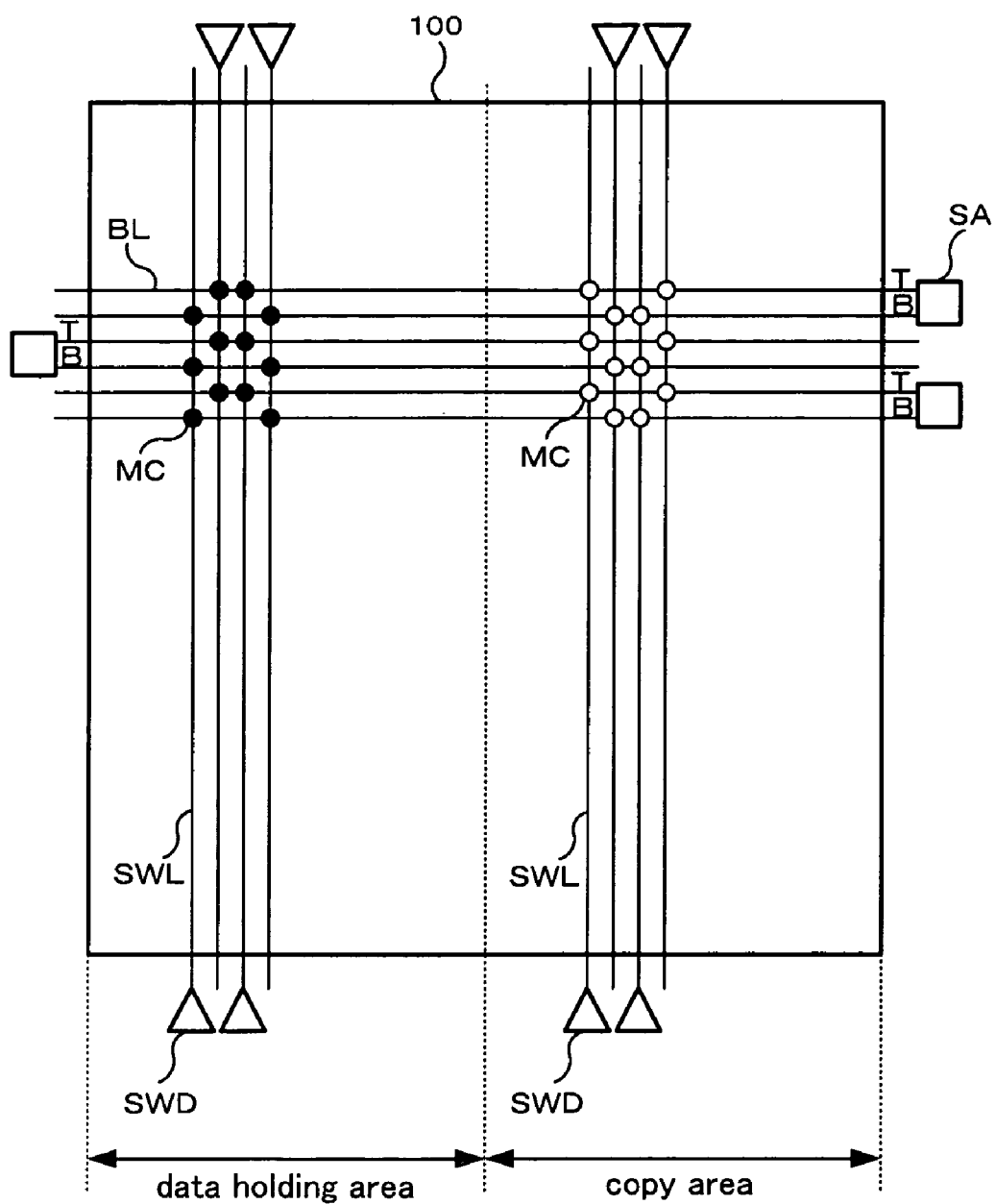
FIG. 3 is a conception diagram for explaining a technique of the present invention in one MAT.

FIG. 3 is a conception diagram for explaining a technique of the present invention in one MAT 100. In this example, 128 Mbits (½) of the entire memory array 10 is set as the data holding capacity. In the MAT 100 shown in FIG. 3, a plurality of sub-word lines SWL are arranged in parallel, and sub-word drivers SWD are respectively connected to one ends of the sub-word lines SWL, a plurality of bit lines BL are arranged in parallel to one another such as to intersect with the sub-word lines SWL, and the bit lines BL are connected to two ends, i.e., one of input terminals (T-side) and the other input terminal (B-side) of the sense amplifier SA two each. Memory cells MC each comprising an MOS transistor and a capacitor are arranged in a matrix form in an intersection between each sub-word line SWL and bit line BL. Since the entire one MAT 100 has 512 sub-word lines SWL and 512 pairs (1024) bit lines BL, 512×512 memory cells MC in all are included in the entire one MAT 100. Since each memory cell MC has one bit data, one MAT 100 has storage capacity of 512×512 (256K) bits.

The sub-word line SWL takes a logical product of an output of the main word line and a decode output of lower bits (X0 to X2) of the row address and outputs the same. In the following explanation, in order to facilitate understanding, explanation of FIG. 3 is omitted, and the output of the main word line will be explained as representative.

Each memory cell MC is disposed on one of the pair of bit lines BL connected to T-side and B-side of the sense amplifier SA. On the bit lines BL, in order to equalize the load capacities (floating capacities) of both the bit lines BL, and to equalize the bit line length to reduce chip size or unbalance of driving noise, it is preferable that the same number of memory cells MC are disposed on T-side and B-side.

In FIG. 3, the sub-word lines SWL are divided into two areas, and the left half is the holding area, and the right half is the copy area. In this case, the holding area and the copy area are arranged symmetrically having the same size (128k bits), and each of them has 256 sub-word lines SWL. Before the self-refresh operation is executed, memory cells MC (shown with black circles) included in the holding area are defined as a copy source, and memory cells MC (shown with hollow circles) on the same pair of bit lines included in the copy area are defined as a copy destination, and data of the copy source is copied to the copy destination.

To reduce the driving noise and to equalize the bit line loads on T-side and B-side of the sense amplifier SA, it is preferable that the memory cell MC of the copy destination (hereinafter referred to as "copy destination cell MC") I connected to the B-side bit line BL when the memory cell MC of the copy source (hereinafter referred to as "copy source cell MC") is connected to T-side bit line BL. If the copy source cell MC is connected to the B-side bit line BL, it is preferable that the copy destination cell MC is connected to the T-side bit line BL.

It is preferable that the bit line BL to which the copy source cell MC is connected and the bit line BL to which the copy destination cell MC is connected are separated into T-side and B-side, but even if the memory cells MC of the copy source and the copy destination are connected to any one of the same pair of bit lines commonly connected to the sense amplifier SA, the present invention can be applied also.

When the self-refresh operation is executed after the copy operation from the holding area to the copy area, two sub-word lines SWL which intersect with the copy source cell MC and the copy destination cell MC on the same bit line BL are selected at the same time. Therefore, from the copy source cell MC and the copy destination cell MC, accumulated charge in association with the same data are output together through the bit line BL. Thereby, longer period refresh is realized, and the current consumption can remarkably be reduced. Concrete copy operation and self-refresh operation and their effects will be described later.

In the example shown in FIG. 3, the data holding capacity is set to half, i.e., 128 Mbits of the entire memory array 10, but the setting method of the data holding capacity in the partial array self-refresh of the first embodiment has various variations. The data holding capacity can be variously changed to ¼ (64 Mbits), ⅛ (32 Mbits) and 1/16 (16 Mbits) of the entire memory array 10 for example.

As the data holding capacity, if the entire memory array 10 can be switched in M stages at maximum such as ½, $½^2$, ... $½^M$ (M is integer), it becomes easy to realize the circuit configuration. That is, it becomes possible to divide one holding area and 2M−1 copy areas and to designate them using M bits of the row address, and a circuit configuration which is suitable for operation of the first embodiment can be realized.

Figure 4A:
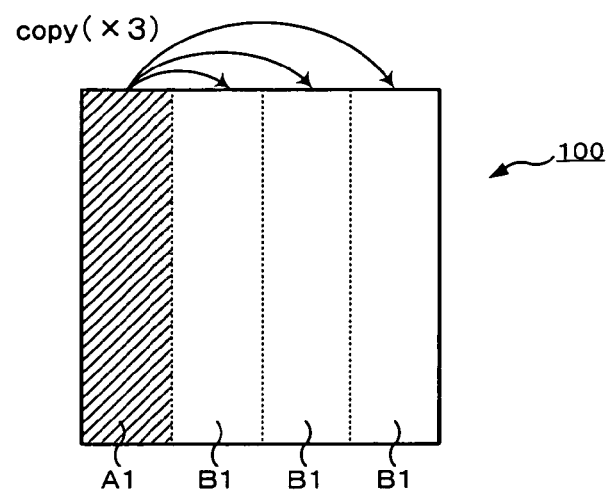
FIGS. 4A, 4B and 4C are diagrams showing a relation in the MAT between the data holding area (copy source) and the copy area (copy destination) in copy operation when the data holding capacity of the memory arrays variously changed.
Figure 4B:
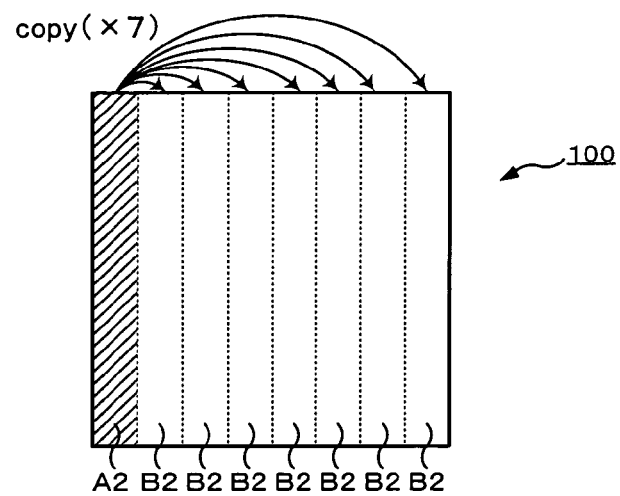
Figure 4C:
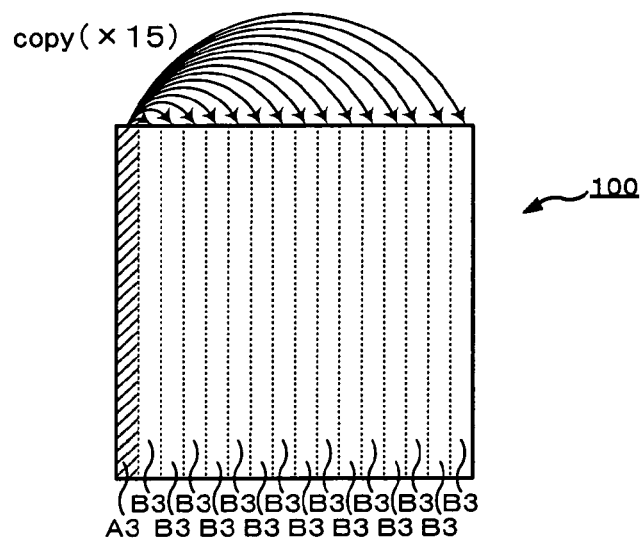

Next, FIG. 4 show a relation in the MAT 100 between the data holding area (copy source) and the copy area (copy destination) in copy operation when the data holding capacity of the memory array 10 is variously changed. FIG. 4A shows a case in which the data holding capacity is set to 64 Mbits (¼), FIG. 4B shows a case in which the data holding capacity is set to 32 Mbits (⅛) and FIG. 4C shows a case in which the data holding capacity is set to 16 Mbits (1/16) in a state in which the MAT 100 is varied from that shown in FIG. 3 in accordance with the variation of the data holding capacity of the memory array 10.

When the data holding capacity is ¼ of the entire memory array 10, the MAT 100 is divided into four each having 128 sub-word lines SWL as shown in FIG. 4A. A data holding area (hereinafter referred to as simply "holding area") A1 is set in one side of the MAT 100, and copy areas B1 are set in other three locations. When the self-refresh is executed, all data in the holding area A1 (copy source) is copied to the three copy areas B1 respectively. Therefore, bit data in arbitrary one memory cell in the one holding area A1 is copied to the three memory cells in the three copy areas B1 to B3, and the same bit data is held in the total 4 memory cells on the same bit line.

Similarly, when the data holding capacity is ⅛ of the entire memory array 10, the MAT 100 is divided into eight as shown in FIG. 4B, and one holding area A2 and seven copy areas B2 are set. When the data holding capacity is 1/16 of the entire memory array 10, the MAT 100 is divided into sixteen as shown in FIG. 4C, and one holding area A3 and fifteen copy areas B3 are set. If the copy operation is executed, the same bit data is held in the eight memory cells on the same bit line in the case of FIG. 4B, and the same bit data is held in the sixteenth memory cells on the same bit line in the case of FIG. 4C.

FIG. 4 only shows one MAT 100, but when the data holding capacity is ¼ of the entire memory array 10, all of the MATs 100 included in the four banks A to D are in the state shown in FIG. 4A. For example, in the entire memory array 10, total 4×256 regions are secured in the holding areas A1, A2 and A3 of the MATs 100 shown in FIGS. 4A to 4C.

In the first embodiment, in addition to the switching setting of the data holding capacity in the plurality of stages, normal self-refresh and partial array self-refresh may be switched in the entire memory array 10. In this case, a setting register for holding the setting contents is provided, and ON/OFF information of a partial array self-refresh mode (hereinafter referred to as "PASR mode") and selection information of the data holding capacity corresponding to the PASR mode may be held in the setting register.

Figure 5:
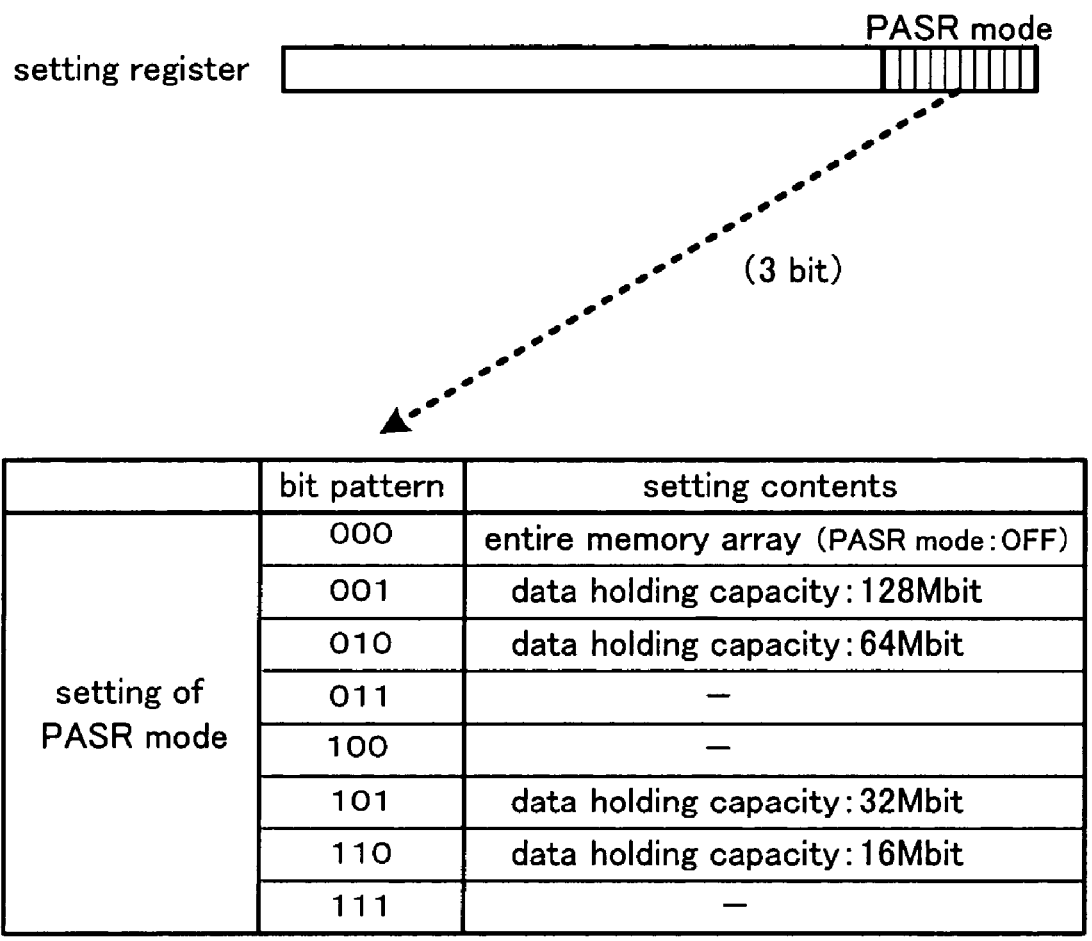
FIG. 5 is a diagram showing one example of the setting register for setting information concerning the PASR mode.

For example, FIG. 5 shows one example of the setting register for setting information concerning the PASR mode. In the example shown in FIG. 5, three bits of the setting register are allocated to information concerning the PASR mode, and the setting of the PASR mode can selectively switched in accordance with the bit pattern. That is, it is possible to selectively set whether the PASR mode is turned OFF to hold data in the entire memory array 10, or one of 128 Mbits (½), 64 Mbits (¼), 32 Mbits (⅛) and 16 Mbits (1/16) of the memory array 10 is set as the data holding capacity.

Figure 6:
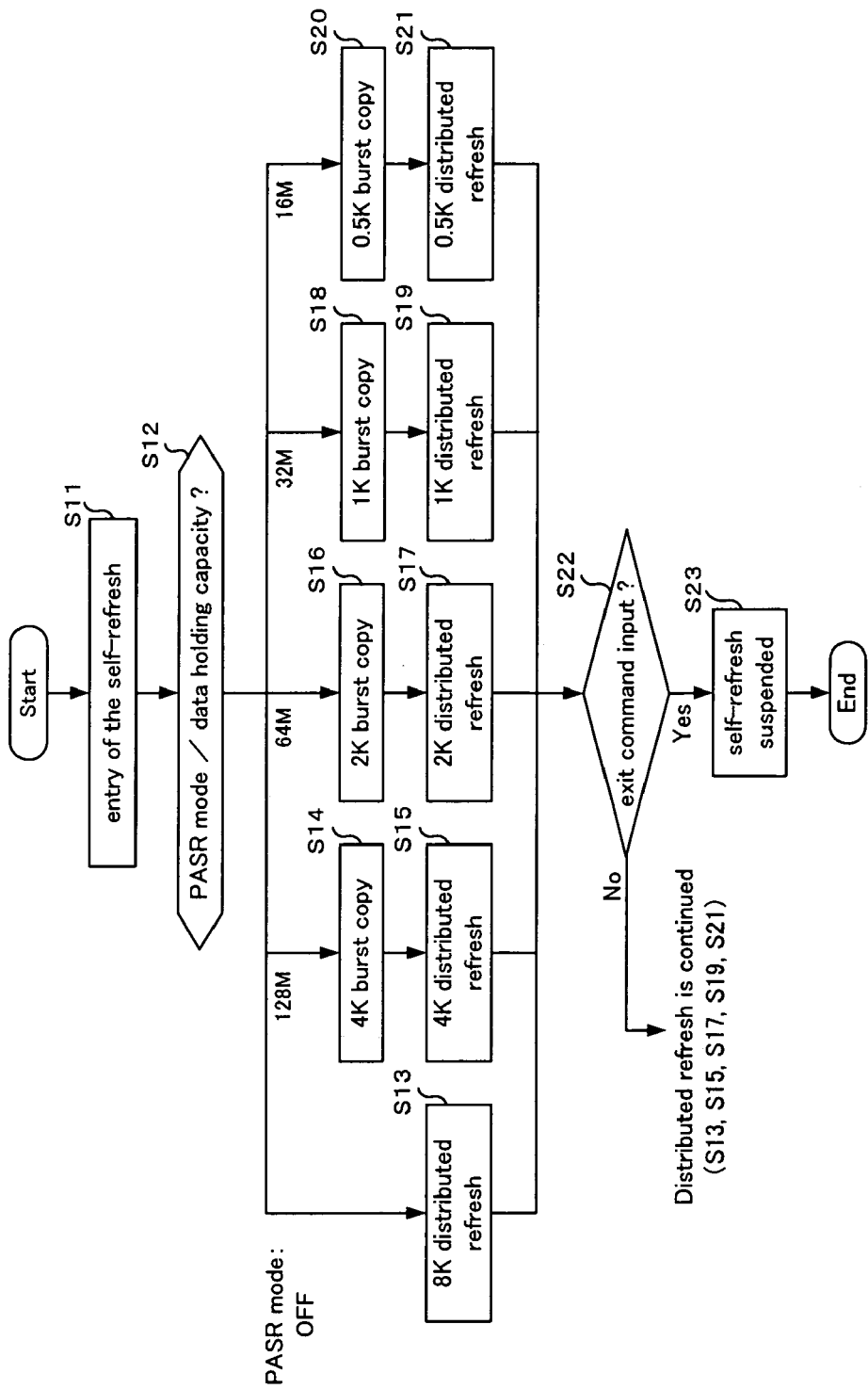
FIG. 6 is a flowchart for explaining control flow of the self-refresh of the DRAM of the first embodiment.

Next, the operation of the self-refresh executed in the DRAM will be explained with reference to FIGS. 6 to 12. FIG. 6 is a flowchart for explaining control flow of the self-refresh of the DRAM. FIGS. 7 to 12 show examples of circuit configuration showing an essential portion related to the self-refresh in the DRAM and various signal waveforms.

In FIG. 6, in an operation state with low power consumption such as standby mode of the mobile device, the entry command of the self-refresh is input as a control command, and the self-refresh operation is started (entry) (step S11). At this time point, desired information concerning the PASR mode is already set in the setting register.

Then, the information in the setting register is referred to and processing to be executed is determined (step S12), and the following different process are executed in accordance with the setting contents. First, when the PASR mode is set OFF, the row address is counted up in the entire memory array 10 by the refresh counter 50, and 8192 word lines are selected and driven sequentially to execute distributed refresh (step S13). When the distributed refresh is executed, control is performed such that intervals between refresh operations for each word line become equal to each other.

When the PASR mode is set ON, burst copy from the holding area (copy source) to the copy area (copy destination) is executed in accordance with the setting of the data holding capacity (steps S14, S16, S18 and S20). When the data holding capacity is set to 128 Mbits, burst copy from the holding area including 4096 word lines is executed (step S14). In step S14, 4096 word lines in the holding area are selected and driven sequentially, and 4096 word lines in the copy area are selected and driven in accordance with a later-described technique so that data is held in 2 memory cells/1 bit. When the burst copy is executed, control is performed such that all of the word lines are collectively selected sequentially.

Then, distributed refresh in the holding area including 4096 word lines is executed (step S15). In step S15, 4096 word lines in the holding area are selected and driven sequentially, and 4096 word lines in the copy area are selected and driven with the same timing to hold data in the entire memory array 10.

Like the above-described operation, when the data holding capacity is set to 64 Mbits, burst copy and distributed refresh corresponding to the holding area including 2048 word lines are executed (steps S16 and S17). When the data holding capacity is set to 32 Mbits, burst copy and distributed refresh corresponding to the holding area including 1024 word lines are executed (steps S18 and S19). When the data holding capacity is set to 16 Mbits, burst copy and distributed refresh corresponding to the holding area including 512 word lines are executed (steps S20 and S21). Thereby, data is held in 4 memory cells/1 bit when the data holding capacity is 64 Mbits, data is held in 8 memory cells/1 bit when the data holding capacity is 32 Mbits, and data is held in 16 memory cells/1 bit when the data holding capacity is 16 Mbits.

Next, when an exit command from the self-refresh is input as a control command at a predetermined timing during the execution of the distributed refresh (Yes in step S22), the self-refresh operation is suspended (exit) (step S23). Thereafter, the process is shifted to a normal operation (read or write). In step S23, when there is a memory cell whose data is destroyed among a plurality of memory cells which hold the same data, it is necessary to repair the same. A concrete operation thereof will be described later.

When the exit command is not input (No in step S22), since each distributed refresh is continued, the process is shifted to any one of the steps S13, S15, S17, S19 and S21, and the same processing is repeated.

Figure 7:
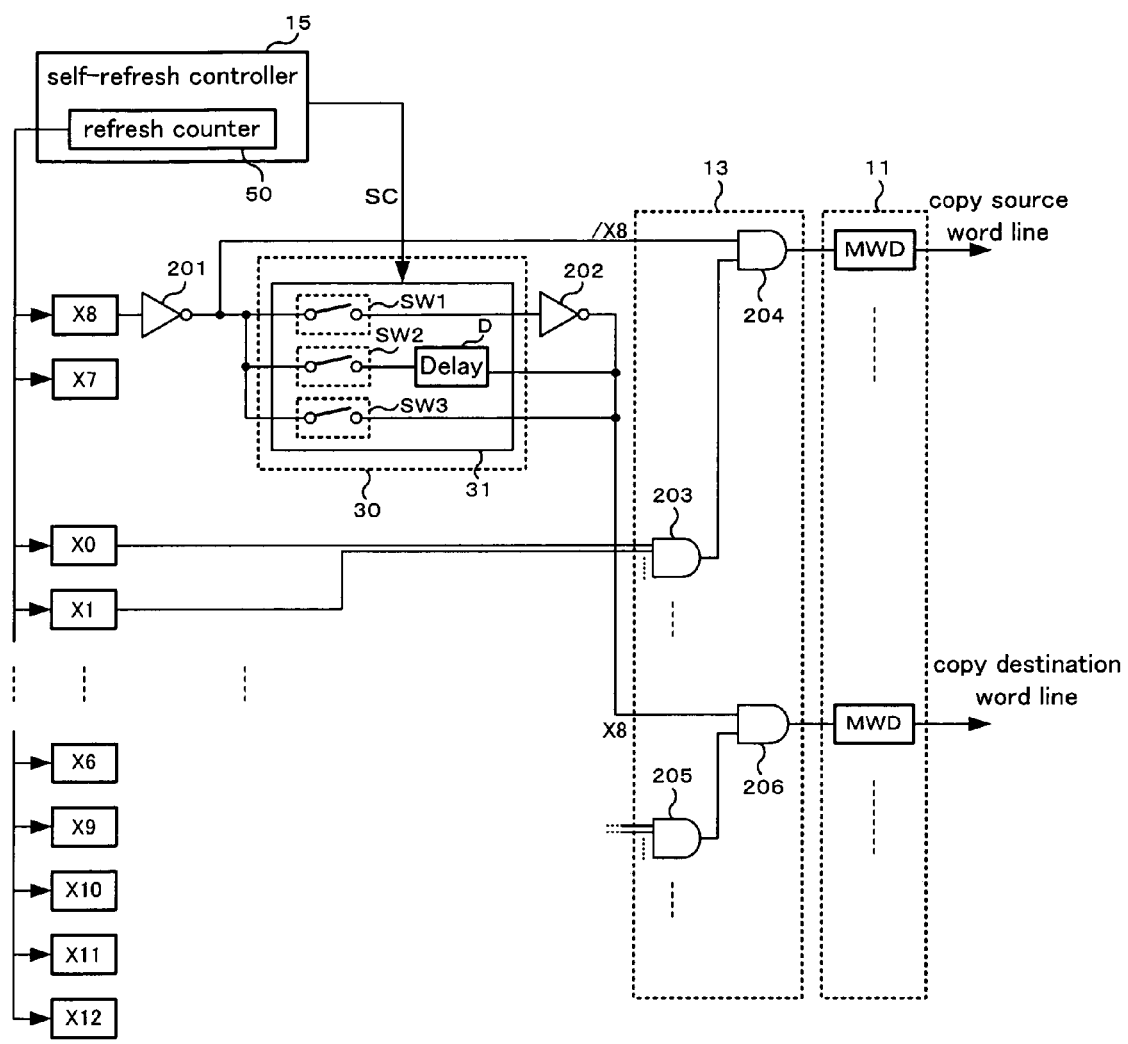
FIG. 7 is a diagram showing an example of the circuit configuration of an essential portion related to the self-refresh operation corresponding to the data holding capacity of 128 Mbits only.

Next, circuit configuration and operation in the DRAM for realizing the partial array self-refresh in the first embodiment will be explained. For convenience sake of explanation, it is assumed that the data holding capacity is set to 128 Mbits only (½ of the entire capacity). FIG. 7 shows an example of the circuit configuration of an essential portion related to the self-refresh operation corresponding to the data holding capacity. In FIG. 7, a circuit portion which selects and drives the word line by the operation of the row decoder 13 and the main word driver 11 under the control of the self-refresh controller 15 is shown. The row decoder 13 and the main word driver 11 comprise a large number of constituent elements corresponding to the number of word lines, but only portions thereof are shown in FIG. 7.

Here, of row addresses X0 to X12 output from the refresh counter 50, bit X8 is input to the row address switch unit 30. In this example, the row address switch unit 30 comprises X8 switch unit 31 which switches the bit X8 of the row address. Four bits of the row address are required for designating the MAT 100 in the bank, and thus 9 bits are allocated for designation of the row address in the one MAT 100, and the most significant bit thereof is bit X8.

In FIG. 7, the X8 switch unit 31 is provided between two inverters 201 and 202, and includes three switches SW1, SW2 and SW3, and a delay section D. An inverted bit /X8 of bit X8 output from the inverter 201 is input to the switches SW1 to SW3. ON/OFF switching operation of the switched SW1 to SW3 is controlled based on a control signal SC supplied from the self-refresh controller 15.

The self-refresh operation corresponding to the circuit configuration in FIG. 7 will be explained. FIG. 8 shows control contents of the X8 switch unit 31 in each operation state. In the normal operation of the DRAM, only the switch SW1 is ON, and switches SW2 and SW3 are OFF. Thus, in FIG. 7, an inverted bit /X8 is input to a copy source-side AND circuit 204 of the row decoder 13, and bit X8 is input to a copy destination-side AND circuit 206 of the row decoder 13. In this case, in the MAT 100, a predetermined word line of the holding area is selected when X8=0, and a predetermined word line in the copy area is selected when X8=1. Therefore, it is possible to access any of the holding area and the copy area at an arbitrary row address.

On the other hand, In the burst copy (step S14 in FIG. 6), only the switch SW2 is ON, and switches SW1 and SW3 are OFF as shown in FIG. 8. In this case, an inverted bit /X8 output through the switch SW2 is input to the copy destination-side AND circuit 206 after a predetermined delay time of the delay section D. Thus, when X8=0, a predetermined word line in the holding area is selected, and a corresponding word line in the copy area is selected at a slightly delayed timing. By repeating this process for all of the word lines in the holding area, it is possible to copy all data of the holding area into the copy area.

Figure 9A:
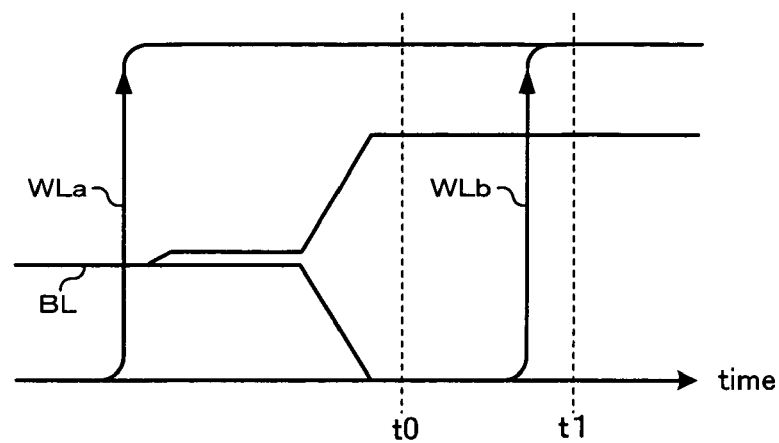
FIGS. 9A and 9B are signal waveform diagrams corresponding to the circuit configuration in FIG. 7.

The operation at that time will be explained using signal waveform diagram in FIG. 9A. As shown in FIG. 9A, a selected word line WLa in the holding area is driven and the voltage level rises and then, minute voltage variation of outputs of the bit lines BL occurs due to the accumulated charge of the memory cell on the intersection with respect to the selected word line WLa. This voltage variation is amplified by the sense amplifier SA, and the voltage level is determined high or low at timing t0. After delay time of the delay section D is elapsed from the rising timing of the selected word line WLa, the voltage level of the corresponding word line WLB in the copy area rises. As the delay time of the delay section D, it is necessary to secure time required for amplifying the outputs of the bit lines BL by the sense amplifier SA.

In FIG. 9A, if the voltage level of the corresponding word line WLB rises, the accumulated charge of the memory cell in the holding area is accumulated in the memory cell in the copy area through the same bit line BL, thereby the data is copied. At that time, the memory cell in the copy area is determined high or low at timing t1. The corresponding word line WLb in the copy area corresponds to a row address which is obtained by adding 256 to the row address of the selected word line WLa in the holding area if arrangement in the MAT 100 shown in FIG. 3 is taken as an example.

As shown in FIG. 8, only the switch SW3 becomes ON and the switches SW1 and SW2 become OFF when the self-refresh is executed (step S15 in FIG. 6). In this case, an inverted bit /X8 is not delayed through the switch SW3, and is input to the copy destination-side AND circuit 206. Thus, when X8=0, a predetermined word line in the holding area is selected, and a corresponding word line in the copy area is selected at the same timing.

Figure 9B:
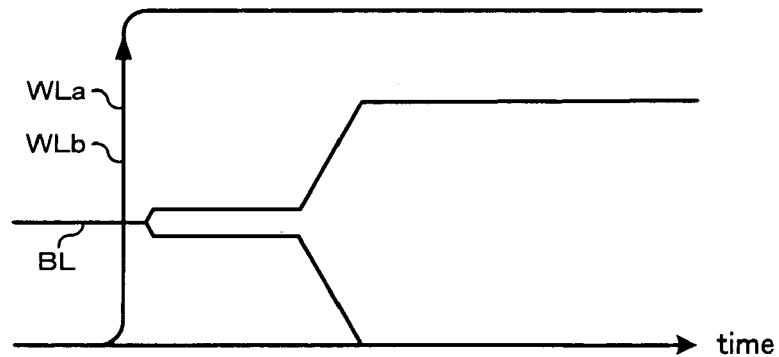

The operation at that time will be explained using a signal waveform diagram in FIG. 9B. As shown in FIG. 9B, voltage levels of a selected word line WLa in the holding area and a corresponding word line WLB in the copy area rise at the same time. The outputs of the bit lines BL is varied due to the accumulated charge of the memory cells on both the intersections of the selected word line WLa and the corresponding word line WLb. Therefore, about two times voltage variation as compared with FIG. 9A is generated, this is amplified by the sense amplifier SA and the voltage level is determined high or low. FIG. 9B shows a signal waveform in 2 memory cells/1 bit. A case in which the number of the memory cells per 1 bit is greater than two will be explained later.

Figure 10:
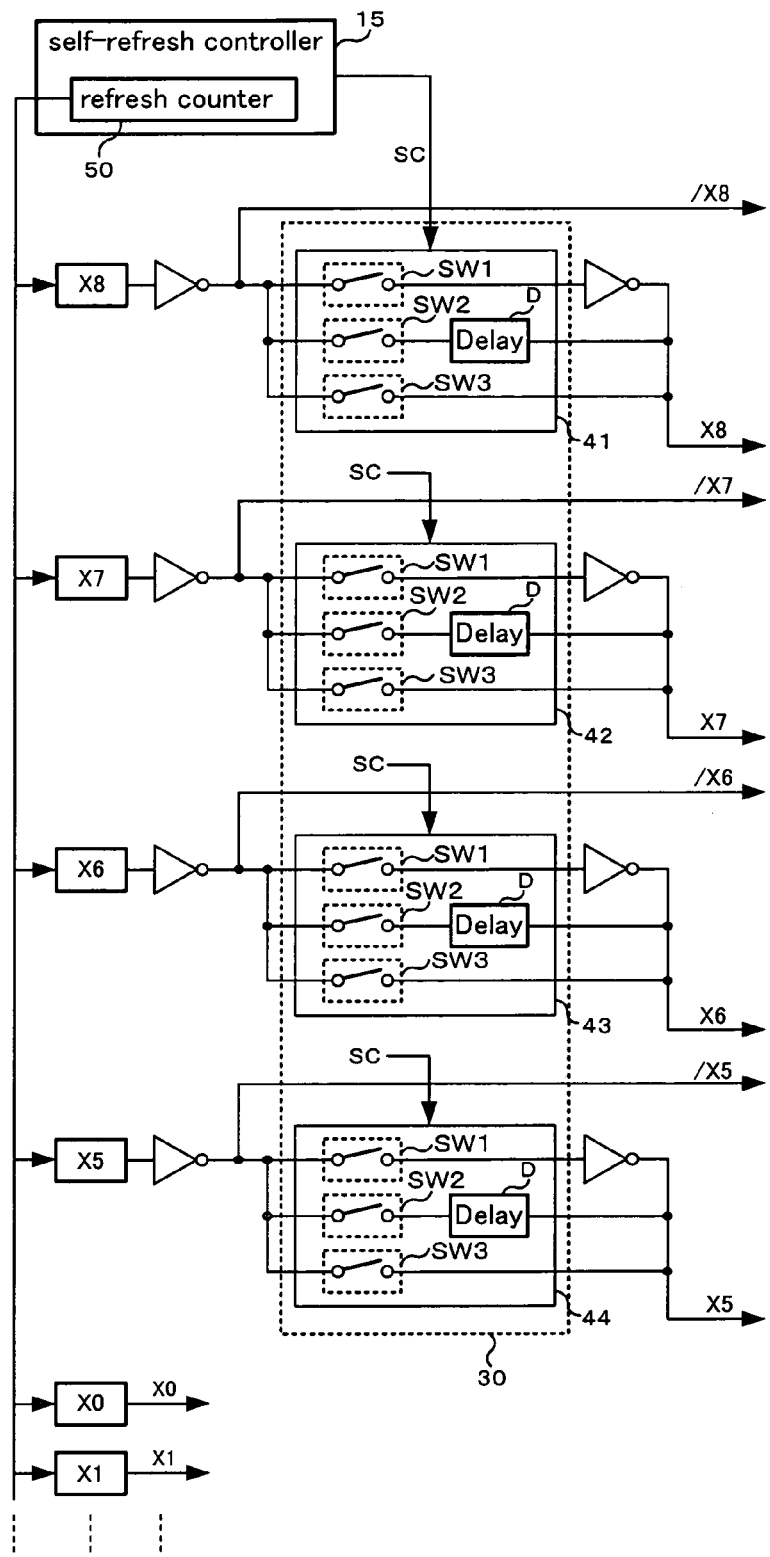
FIG. 10 is an example of the circuit configuration corresponding to the circuit configuration in FIG. 7.

Next, in the DRAM of the first embodiment, circuit configuration and operation when the data holding capacity is switched in a plurality of stages will be explained. FIG. 10 shows an example of the circuit configuration corresponding to FIG. 7 when variation of the data holding capacity of the setting register is assumed and 128 Mbits, 64 Mbits, 32 Mbits and 16 Mbits can be switched to set as the data holding capacity. In FIG. 10, since the row address switch unit 30 controls switching operation of bits X8, X7, X6 and X5 of the row address, the row address switch unit 30 comprises X8 switch unit 41, X7 switch unit 42, X6 switch unit 43 and X5 switch unit 44. Although the row decoder 13 and the main word driver 11 are omitted in the circuit configuration in FIG. 10, they are disposed in the same manner as that shown in FIG. 7.

These switch units 41 to 44 have the same configuration as that of the X8 switch unit 31 shown in FIG. 7, each of the switches includes the switches SW1, SW2, SW3 and the delay section D, and ON/OFF switching operation of each of the switches SW1 to SW3 is controlled based on the control signal SC which is supplied from the self-refresh controller 15.

FIG. 11A shows control contents with respect to the switch units 41 to 44 for each of the data holding capacities. The number of memory cells per 1 bit is varied by two times in association with the four kinds of data holding capacities which can be set, and the switch units 41 to 44 to be controlled is varied correspondingly.

First, with data holding capacity of 256 Mbits in which the PASR mode is OFF, all of four switch units 41 to 44 are fixed. With data holding capacity of 128 of Mbits (2 memory cells/1 bit), only the X8 switch unit 41 is to be controlled. With data holding capacity of 64 Mbits (4 memory cells/1 bit), the two X8 and X7 switch units 41 and 42 are to be controlled. With data holding capacity of 32 Mbits (8 memory cells/1 bit), the three X8 to X6 switch units 41 to 43 are to be controlled. With data holding capacity of 16 Mbits (16 memory cells/1 bit), all of X8 to X5 switch units 41 to 44 are to be controlled. In any of the cases, one or more of switch units 41 to 44 which are not to be controlled are fixed.

FIG. 11B shows control contents with respect to the switch units 41 to 44 which are to be controlled in FIG. 11A. The control contents in FIG. 11B are the same as that of FIG. 8. FIG. 11C shows control contents with respect to the switch units 41 to 44 which are fixed in FIG. 11A. In this case, only the switch SW1 is always ON, the switches SW2 and SW3 are OFF, and they are maintained in the normal operation state shown in FIG. 11B.

By performing such control, a predetermined word line in the holding area is selected at the time of the burst copy, and each word line in a plurality of copy areas corresponding to bit pattern of bits X5 to X8 is selected at a slightly delayed timing. The word lines in the holding area and the plurality of copy areas are selected simultaneously at the time of self-refresh. For example, a case of 16 memory cells/1 bit will be explained. A case in which all of four bits of the X5 to X8 of the row address are 0 corresponds to the holding area, arbitrary combinations (fifteen ways) in which 1 is included in four bits corresponds to any of the copy areas, and total 16 word lines are selected and driven through the switches SW2 and SW3 of the switch units 41 to 44.

Figure 12A:
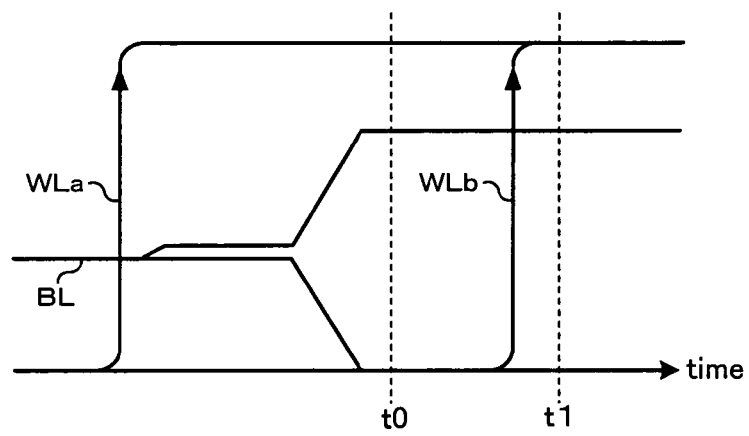
FIGS. 12A and 12B are signal waveform diagrams corresponding to the circuit configuration in FIG. 10.

FIG. 12 are signal waveform diagrams when the memory cell is set to 16 memory cells/1 bit in the circuit configuration in FIG. 10. First, signal waveforms in FIG. 12A are obtained at the time of burst copy, and the timing and waveform variation are basically the same as those shown in FIG. 9A. In the case of FIG. 12A, after the voltage level of one selected word line WLa in the holding area rises, voltage levels of 15 corresponding word lines WLb of 15 in the copy areas rise at the same time. Minute voltage variation of outputs of the bit lines BL occurs due to the rising of the selected word line WLa, and after it is amplified by the sense amplifier SA, charge is accumulated in each memory cell on intersections with respect to the 15 corresponding word lines WLb. Thereby, the data of the memory cell in the holding area is copied to the 15 memory cells of the copy areas.

Figure 12B:
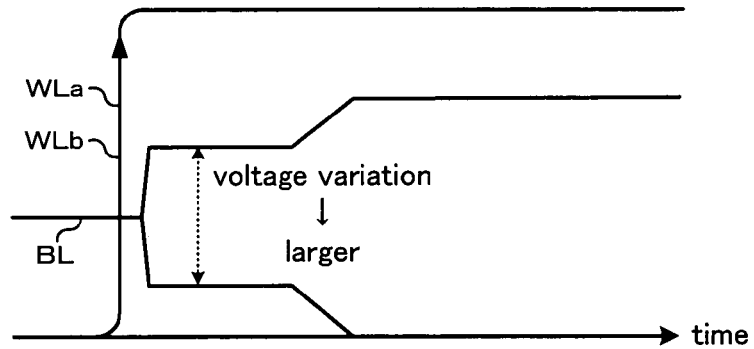

When self-refresh is executed, the signal waveforms in FIG. 12B are obtained. In this case also, the timing and waveform variation are the same as those shown in FIG. 9B, but voltage levels of total 16 word lines of the one selected word line WLa of the holding area and 15 corresponding word lines WLb of the copy areas rise at the same time. At that time, since accumulated charge of the 16 memory cells are varied together, the voltage variation of the output of the pair of bit lines BL becomes larger as compared with FIG. 9B.

Next, current consumption reduction effects in the case of the partial array self-refresh based on the technique of the present invention will be explained. FIG. 13 collectively shows a relation between the data holding capacity which can selectively be set in accordance with configuration of the first embodiment and the operation state of the self-refresh. In FIG. 12, concerning the memory array 10 of 256 Mbits, the data holding capacity, the total number of word lines of the holding area, and the number of memory cells per 1 bit are the same as those described above. The accumulated charge amount per 1 bit (assume that charge is q0 with respect to one memory cell) is increased by two times in proportion to the reciprocal (or the number of memory cells per 1 bit) of the data holding capacity.

If attention is paid to the total number of word lines of the data holding capacity, since the number of driving operations of the word lines is determined by this, this is proportional to operation time required for one time self-refresh (self-refresh of all memory cells in the holding area). Therefore, if the data holding capacity is reduced, the operation time of the self-refresh can be shortened, and the current consumption can be reduced correspondingly (first effect). The first effect is the same as that of the conventional partial array self-refresh method.

On the other hand, if attention is paid to the accumulated charge amount per 1 bit, this is varied in proportion to the number of times of the copy operations for one bit data (i.e., the number of memory cells per 1 bit). That is, if the data holding capacity is reduced and the number of memory cells per 1 bit is increased, the interval between the refreshes can be set longer by the increased accumulated charge amount, and the current consumption can be reduced correspondingly (second effect). This second effect is a feature of the technique of the present invention that can not be obtained by the conventional partial array self-refresh method, and the current consumption can largely be reduced by the combination of the first and second effects.

Here, a relation between the number of memory cells per 1 bit and retention time which is time during which data can be held in the memory cell is conceived. In the case of 2 memory cells/1 bit, it is confirmed by experiment that the retention time is proportional to the accumulated charge amount per 1 bit. For example, retention time in the case of the data holding capacity of 128 Mbits (2 memory cells/1 bit) is two times of that when there is no PASR, and thus the refresh period can be set longer correspondingly. Thus, if the data holding capacity is set to 128M, the current consumption can be reduced to ¼ as compared with normal state (no PASR) by the first and second effects.

Figure 14:
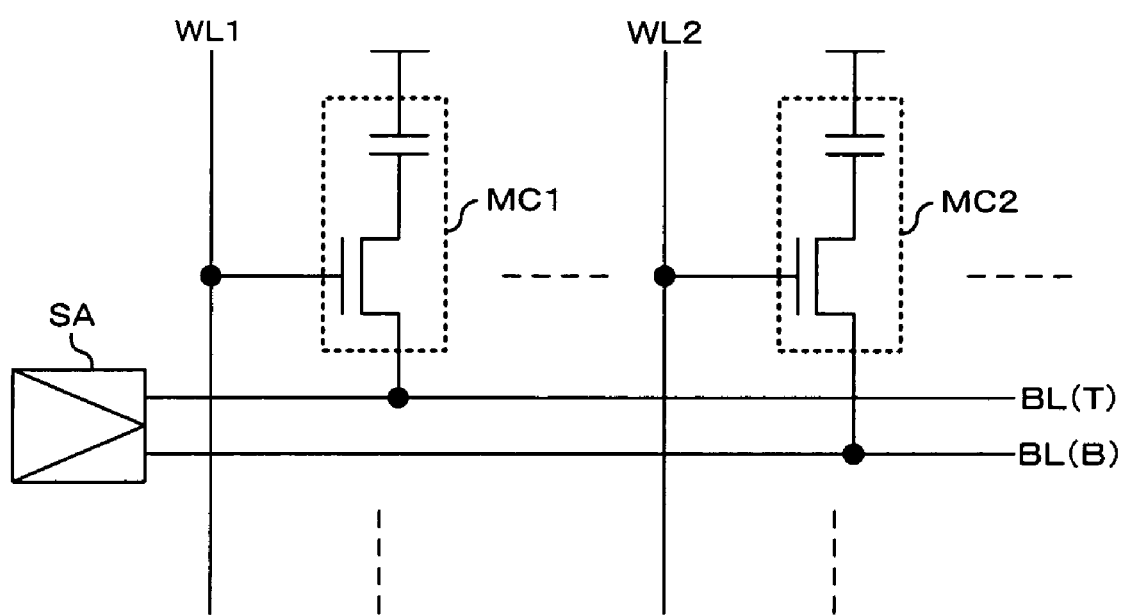
FIG. 14 is a diagram showing a configuration of a circuit portion including two memory cells for explaining an effect of the case of 2 memory cells/1 bit compared with the case of 1 memory cell/1 bit.

The effects in the case of 2 memory cells/1 bit will be explained using FIGS. 14 to 17 which comparing with the case of 1 memory cell/1 bit. FIG. 14 shows configuration of a circuit portion including one memory cell MC1 of the copy source and one memory cell MC2 of the copy destination. The memory cell MC1 is connected to the T-side bit line BL (T) and the memory cell MC2 is connected to the B-side bit line BL (B) with respect to the pair of bit lines connected to the sense amplifier SA. The memory cell MC1 is connected to a word line WL1 and the memory cell MC2 is connected to a word line WL2.

Figure 15A:
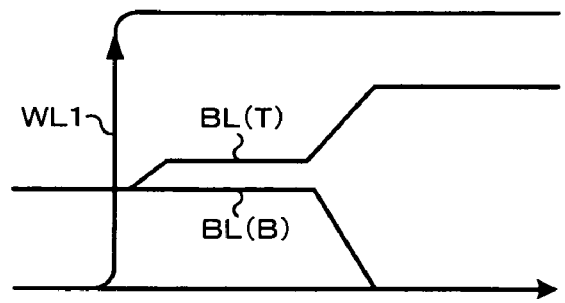
FIGS. 15A, 15B, 15C and 15D are signal waveform diagrams corresponding to the configuration in FIG. 14.
Figure 15B:
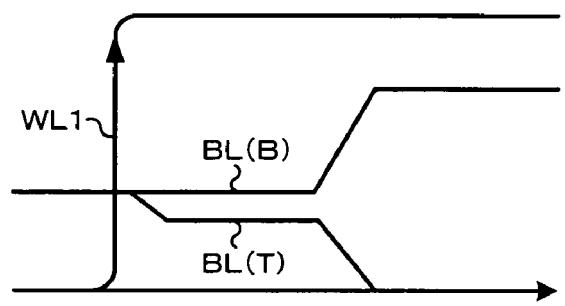
Figure 15C:
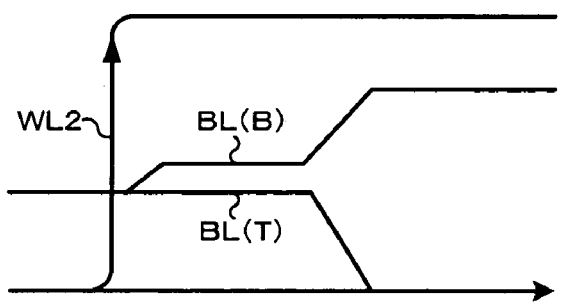
Figure 15D:
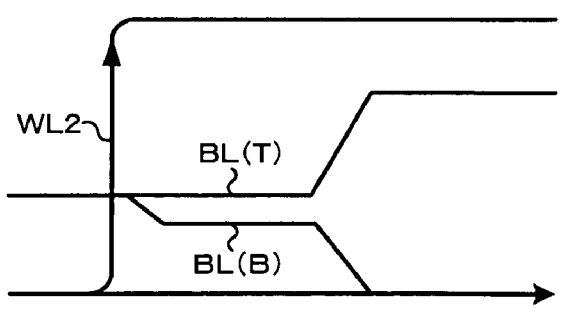
Figure 16A:
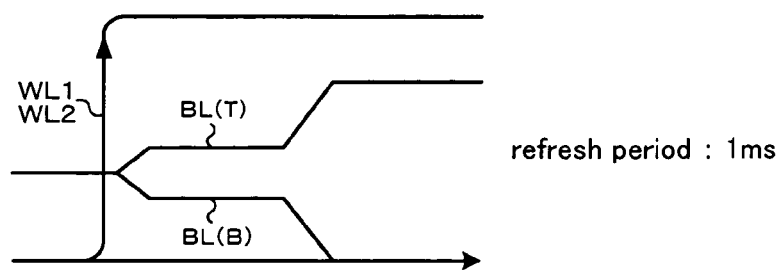
FIGS. 16A, 16B, 16C and 16D are signal waveform diagrams when the refresh period is changed in the case of 2 memory cells/1 bit.
Figure 16B:
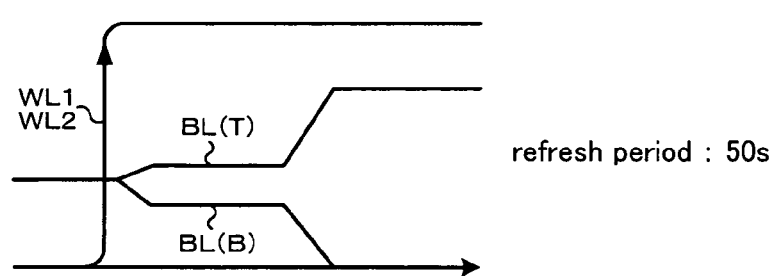
Figure 16C:
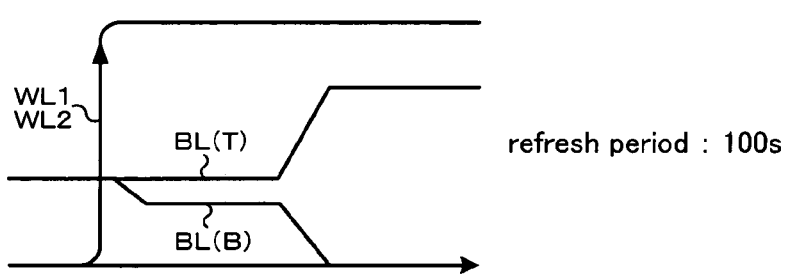
Figure 16D:
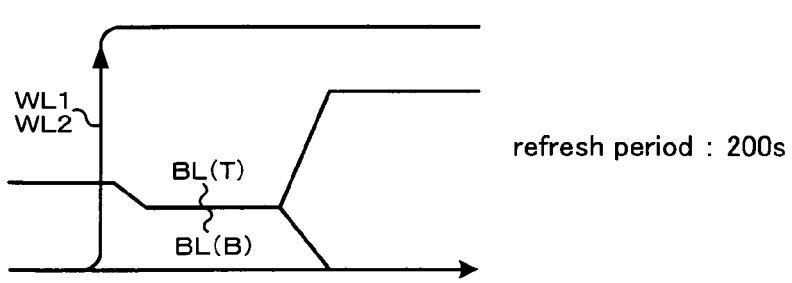

Concerning the memory cells MC1 and MC2 in FIG. 14, the operation in the case of 1 memory cell/1 bit will be explained using the signal waveform diagrams in FIG. 15. The voltage level of the T-side bit line BL (T) at the timing in which the word line WL1 is selected and driven is increased when the high level is stored in the memory cell MC1 (FIG. 15A), and the voltage level is reduced when low level is stored in the memory cell MC1 (FIG. 15B). On the other hand, the voltage level of the B-side bit line BL (B) at the timing in which the word line WL2 is selected and driven is increased when the high level is stored in the memory cell MC2 (FIG. 15C), and the voltage level is reduced when low level is stored in the memory cell MC2 (FIG. 15D).

In the case of 1 memory cell/1 bit, the accumulated charge is reduced by leakage when the memory cells MC1 and MC2 are in high state. If the remaining amount of the accumulated charge is reduced to about half, it becomes difficult to specify the variation of the voltage level and erroneous operation is caused, and thus the refresh period is limited.

Figure 17:
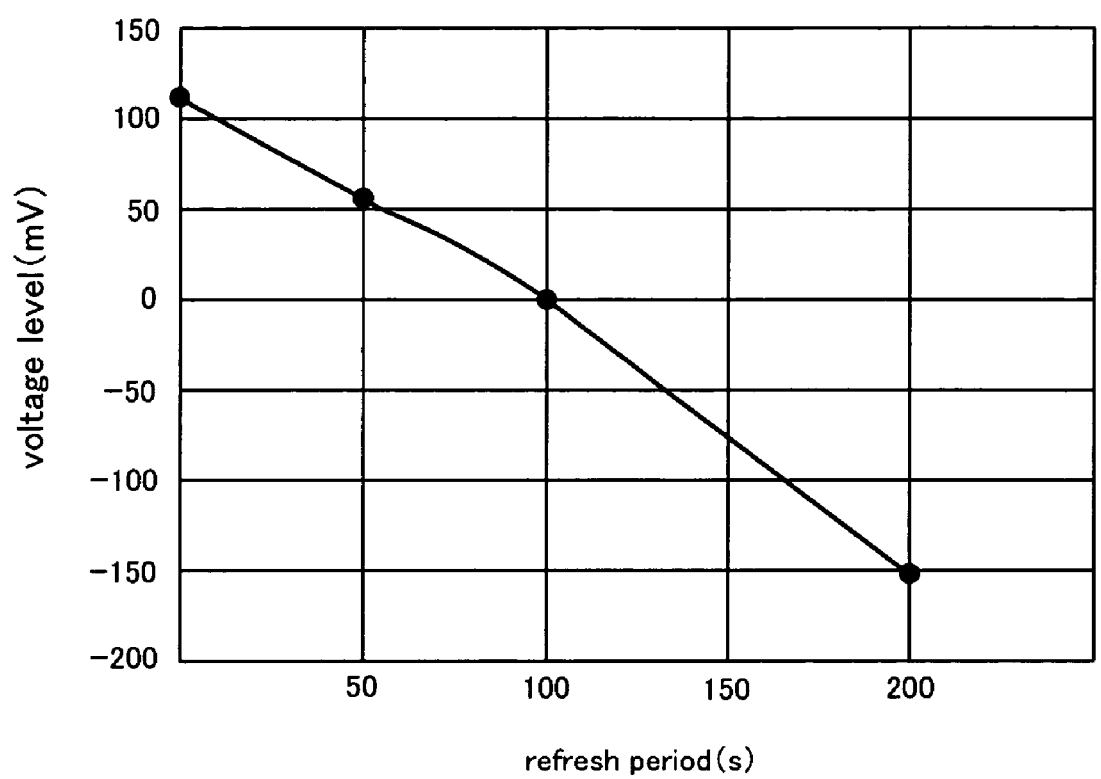
FIG. 17 is a graph showing a relation between the refresh period and voltage level of the bit line based on the signal waveform diagrams in FIG. 16.

On the other hand, In the case of 2 memory cells/1 bit, the refresh period can be increased based on the effect shown in FIGS. 16 and 17. FIG. 16 are signal waveform diagrams when the refresh period is changed in the case of 2 memory cells/1 bit. FIG. 17 is a graph showing a relation between the refresh period and voltage level of the bit line BL based on the signal waveform diagrams in FIG. 16.

As shown in FIG. 16, when the two word lines WL1 and WL2 are selected and driven at the same time, the voltage levels of the T-side bit line BL (T) and the B-side bit line BL (B) are varied in the opposite directions, but the difference between the voltage levels is more reduced as the refresh period is increased in the order of FIGS. 16A, 16B, 16C and 16D. When the refresh period is 100 s, the remaining amount of the accumulated charge of the T-side bit line BL (T) becomes about half, and it is difficult to specify the voltage level of itself. However, since the level difference as compared with the B-side bit line BL (B) is secured, it is possible to normally read the data. When the refresh period becomes 200 s, the remaining amount of the accumulated charge of the T-side bit line BL (T) becomes zero, and the level difference as compared with the B-side bit line BL (B) can not be secured. Therefore, erroneous operation is caused at this time. The refresh period for 2 memory cells/1 bit can be increased by about two times for the 1 memory cell/1 bit.

If the result of the 2 memory cells/1 bit is applied to 4 memory cells/1 bit or higher, the retention time becomes long in proportion to the accumulated charge amount per 1 bit. However, when 4 memory cells/1 bit or higher, the retention time can largely be increased not only by the effect of increase of the accumulated charge, but also effect that fail probability is abruptly reduced when data stored in a plurality of memory cells is to be read.

First, concerning the DRAM of 256 Mbits, an expected value e1 of the fail number in the case of 4 memory cells/1 bit can be obtained by the following equation (1) due to approximation in the worst condition.

$$e1 = \frac{256M}{2}\left(\frac{2}{256M}\right)^2\left(\frac{256M-2}{256M}\right)^{n-2} {}_nC_2 \quad (1)$$

wherein, n represents the fail bit number in each refresh period, ${}_nC_2$ represents the number of combination when 2 is extracted from bits Similarly, expected values e2 and e3 of the fail numbers in the case of 8 memory cells/1 bit and 16 memory cells/1 bit can be obtained by the following equations (2) and (3).

$$e2 = \frac{256M}{4}\left(\frac{4}{256M}\right)^4\left(\frac{256M-4}{256M}\right)^{n-4} {}_nC_4 \quad (2)$$

$$e3 = \frac{256M}{8}\left(\frac{8}{256M}\right)^8\left(\frac{256M-8}{256M}\right)^{n-8} {}_nC_8 \quad (3)$$

According to the probability calculations of the equations (1) to (3), the number of memory cells per 1 bit is increased to 4, 8, 16 such that the multiplexing degree becomes higher, and therefore the retention time can be increased to about 10 times, 40 times and 80 times.

Figure 18:
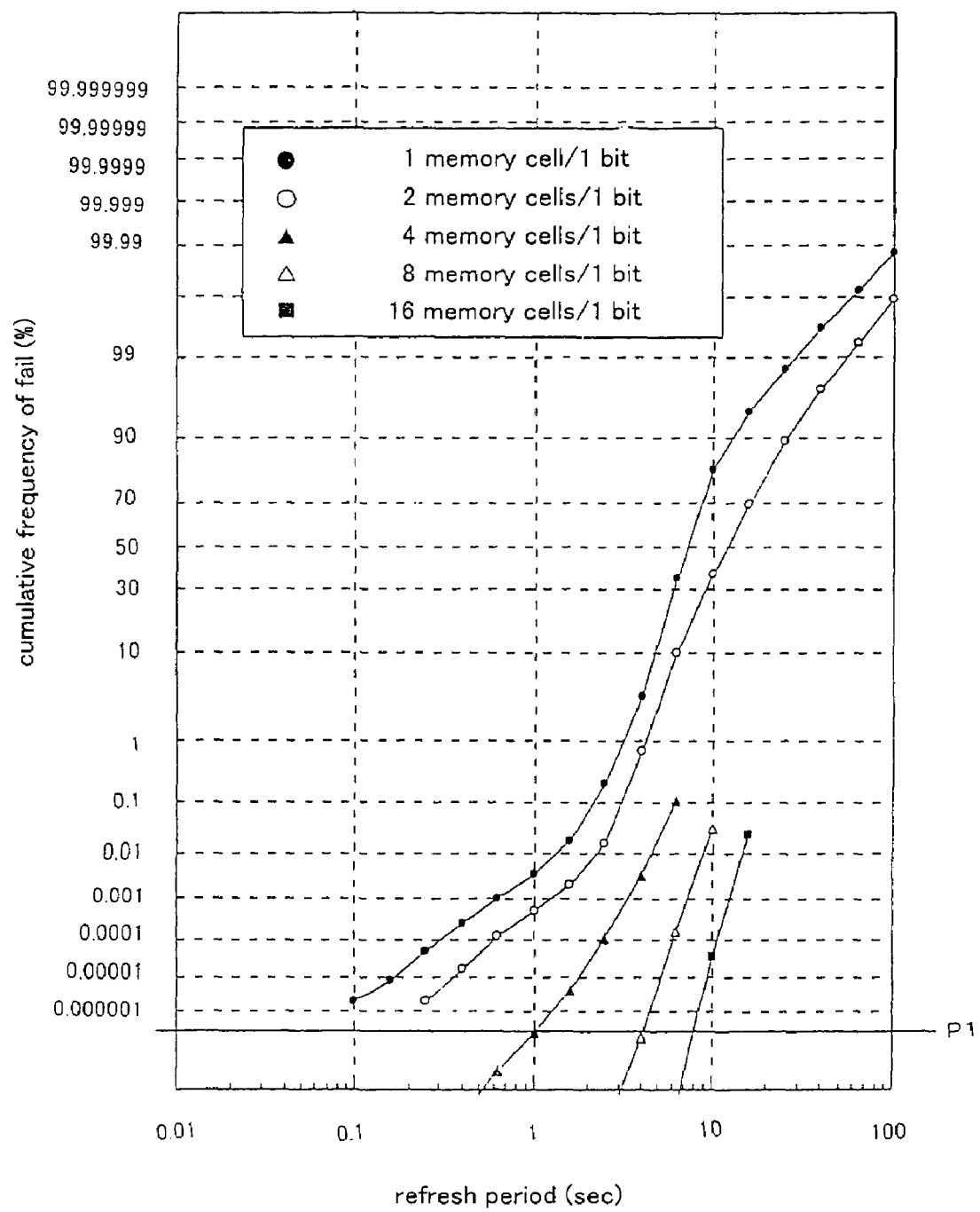
FIG. 18 is a graph showing a relation between cumulative frequency of fail and refresh period when the number of memory cells per 1 bit is changed.

FIG. 18 is a graph showing a relation between cumulative frequency of fail and refresh period when the number of memory cells per 1 bit is changed. In the graph of FIG. 18, the measured values are used when the number of memory cells/1 bit is 1 or 2, and the calculated values of the equations (1) to (3) are used when the number of memory cells/1 bit is 4, 8 or 16. FIG. 18 shows 1 bit fail position P1 when it is assumed that 1 bit fail is permissible limit with respect to the storage capacity of 256 Mbits.

As can be found in the graph shown in FIG. 18, with respect to the similar refresh period, the cumulative frequency of fail is abruptly reduced as the number of memory cells per 1 bit is increased. That is, the degree of reduction of fail is greater than the degree of increase of the accumulated charge amount by holding the data in the multiplexing manner, and thus the retention time is increased correspondingly. A relation between the number of memory cells per 1 bit and the refresh period will be explained with reference to FIG. 19.

Figure 19:
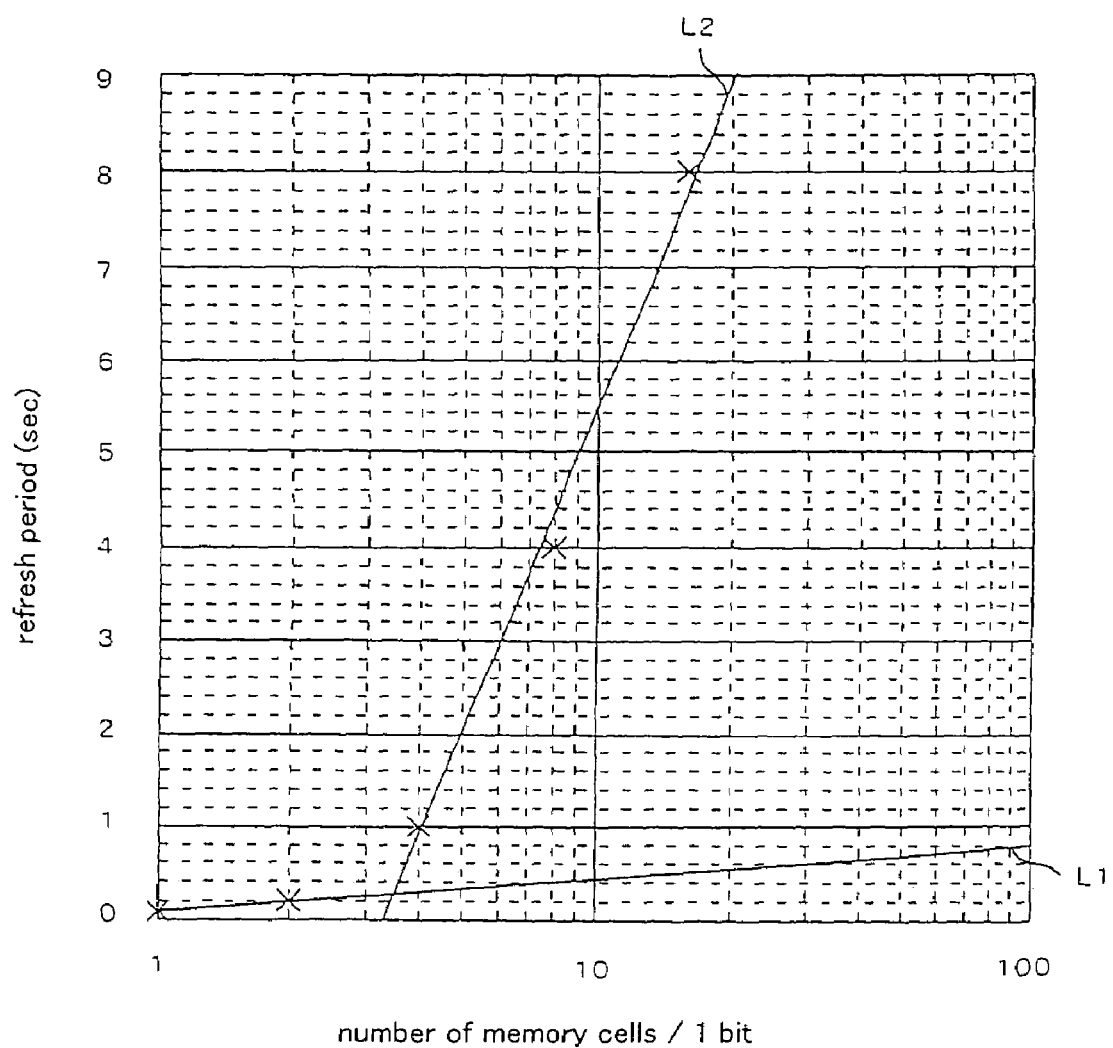
FIG. 19 is a graph showing a relation between the number of memory cells per 1 bit and the refresh period.

FIG. 19 is a graph of appropriate refresh period for keeping the fail in the permissible range when the number of memory cells per 1 bit is varied, and shows two straight lines L1 and L2 superposed on the graph. In reality, the straight line L1 has a parabolic curve characteristic, however, partial characteristic of the straight line L1 in the left side of the graph is approximated to the straight line. There is a tendency that when the number of memory cells per 1 bit is 1 or 2, it is varied in accordance with the straight line L1 but when number of memory cells per 1 bit is 4, 8 or 16, it is varied in accordance with the straight line L2. It can be found that degree of increase in refresh period of the straight line L2 is remarkably large as compared with the straight line L1. In the straight line L1, the accumulated charge amount is increased in proportion to the number of memory cells per 1 bit, and the effect that the retention time is increased is reflected. But in the straight line L2, the fail probability is reduced by multiplexing of the data as shown in FIG. 18, and the effect that the retention time is increased is reflected. In this manner, the refresh period can remarkably be increased as the number of memory cells per 1 bit is increased, and the current consumption of the DRAM can largely be reduced.

Next, processing after exit (step S23 in FIG. 6) of the self-refresh operation in the first embodiment will be explained. As described above, when 1 bit is held in a plurality of memory cells, it is necessary to repair the data destroyed in a particular memory cell. Since the self-refresh operation of long period is executed in the first embodiment, the probability that the data of a memory cell of a word line which is not accessed for a long time is destroyed is increased from the last refresh operation to the exit. A first method for avoiding this problem is to execute the same self-refresh operation as that shown in FIG. 9B or 12B with respect to the entire memory array 10 at the time of exit. According to the first method, however, constant time is required for refresh of the memory array 10 in the DRAM, there is a demerit that shifting to the next processing is delayed. Hence, as a configuration capable of reliably avoiding the above problem at the time of exit, and capable of swiftly shifting to the next processing, a modification in which a circuit having a predetermined function is added to the DRAM will be explained.

Figure 20:
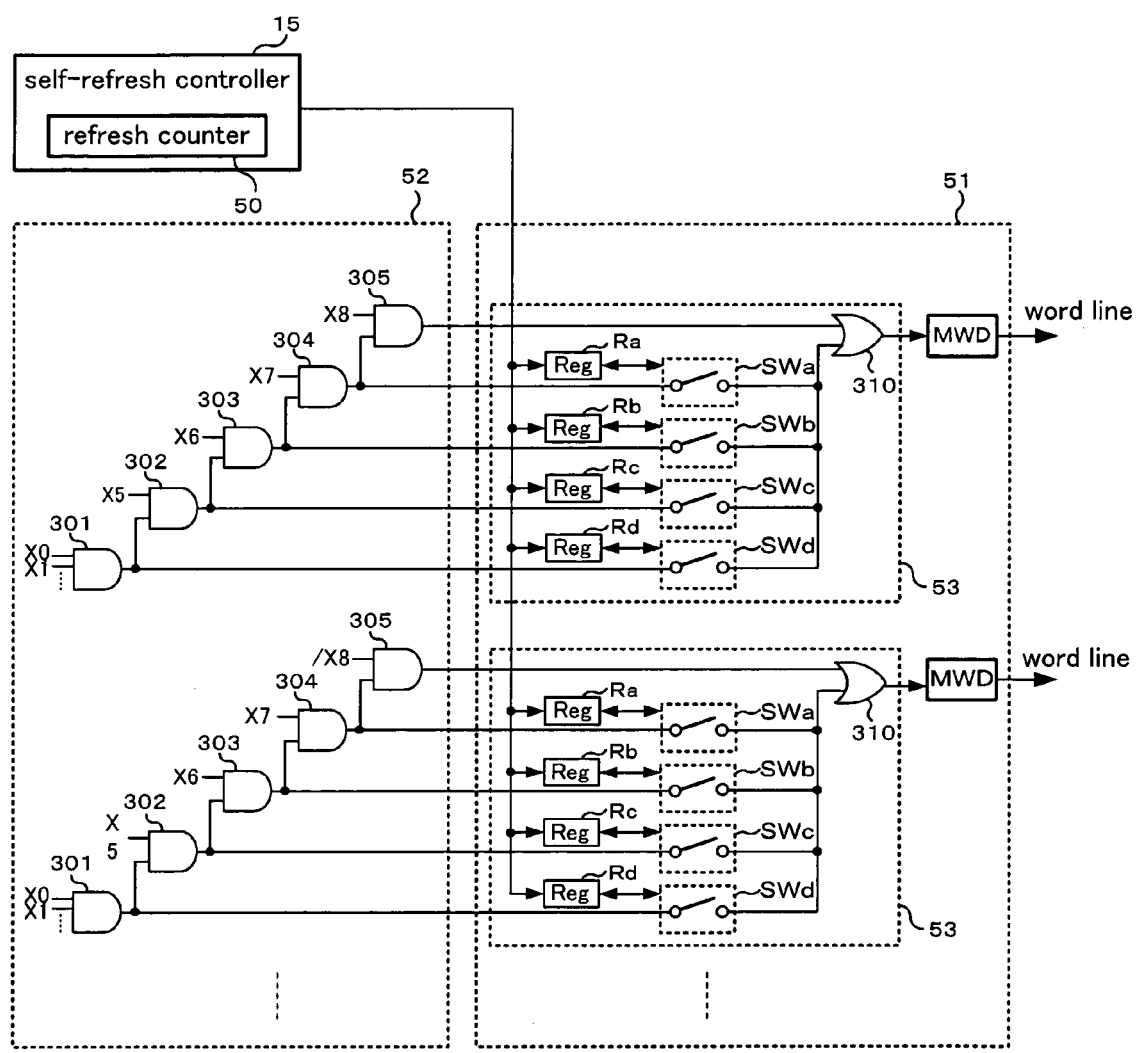
FIG. 20 is a diagram showing a circuit configuration of essential portion of the DRAM corresponding to the modification of the first embodiment.

FIG. 20 shows an example of a circuit configuration of essential portion of the DRAM corresponding to the modification. In this modification, it is assumed that the data holding capacity of the PASR mode is switched in four stage as in FIG. 10. As shown in FIG. 20, this configuration includes a row decoder 52 and a main word driver 51, and they have different circuit configurations from those shown in FIGS. 7 and 10. For convenience sake of explanation of the row decoder 52 and the main word driver 51, only a portion of the circuit is shown.

In FIG. 20, the row decoder 52 to which 13 bit row address is input is provided with a large number of unit circuits for each of word lines. In addition to the AND circuit 301 to which bit X0 to X5, X9 to X12 of the row address are input, four AND circuits 302 to 305 are added to each of the unit circuits. An output of the front stage AND circuit 301 and bit X5 are input to the AND circuit 302. Similarly, outputs of the AND circuits 302 to 304 and bit X6 to X8 are input to the AND circuits 303 to 305 respectively. In the example shown in FIG. 20, two unit circuits respectively corresponding to X8=0 and X8=1 for the row decoder 52 and the main word driver 51 are shown.

The main word driver 51 includes the same number of MWD switch units 53 as that of the word lines as additional circuits. Each MWD switch unit 53 is connected to a main word driver (MWD) which drives one word line. As shown in FIG. 20, each MWD switch unit 53 includes four switches SWa, SWb, SWc, SWd, four control registers Ra, Rb, Rc, Rd and an OR circuit 310. One ends of the switches SWa to SWd are connected to output sides of the AND circuits 301 to 304, and the other ends are connected to the OR circuit 310. The control registers Ra to Rd determine states of the corresponding switches SWa to SWd under the control of the self-refresh controller 15 and control the ON/OFF switching operations.

In such a configuration, control process of the control registers Ra to Rd at the time of self-refresh will be explained. First, immediately after the power supply of the DRAM is turned ON (in the normal operation), the switches SWa to SWd corresponding to the four control registers Ra to Rd are collectively set in the OFF state. Also when the entry command is input, the switches SWa to SWd are collectively set in the OFF state similarly. That is, only the output of the AND circuit 305 is input to the main word driver MWD through the OR circuit 310 before and during the execution of the self-refresh operation. Thus, one word line corresponding to the designated row address is selected and driven.

On the other hand, when the exit command is input during the execution of the self-refresh operation, the control is shifted in accordance with the control contents shown in FIG. 21. In FIG. 21, control registers Ra to Rd having different data holding capacities are to be controlled, and only the switches SWa to SWd corresponding thereto are set in the ON state. However, PASR mode is OFF in the case of the data holding capacity of 256 Mbits, and the switches SWa to SWd corresponding to all of the control registers Ra to Rd are always set in the OFF state. In this state, like the normal operation, one word line is selected and driven. On the other hand, in the case of data holding capacity of 128M to 16 Mbits, any of the switches SWa to SWd corresponding to any of the control registers Ra to Rd is set in the ON state, and other switches are set in the OFF state. In this case, output of any of the AND circuits 301 to 304 in accordance with the data holding capacity is input to the OR circuit 310 together with the output of the AND circuit 305.

For example, if the operation of data holding capacity of 128 Mbits is conceived, in FIG. 20, when the switch SWa is ON, row address without bit X8 is input to the OR circuit 310 through the AND circuit 304 and the switch SWa. Therefore, a word line to which the output of the OR circuit 310 is output is selected and driven no matter whether or not the bit X8 is 0 or 1 (two ways). Based on the same idea, in the case of data holding capacity of 64 Mbits, a predetermined word line is selected and driven no matter whether or not the bit X7 and X8 are 0 or 1 (four ways). In the case of data holding capacity of 32 Mbits, a predetermined word line is selected and driven no matter whether or not the bit X6 to X8 are 0 or 1 (eight ways). In the case of data holding capacity of 16 Mbits, a predetermined word line is selected and driven no matter whether or not the bit X5 to X8 are 0 or 1 (sixteen ways).

With respect to the DRAM of the modification, when an arbitrary address is accessed after exit, operation states of the switches SWa to SWd which function as paths of selection of one word line are determined by the corresponding control registers Ra to Rd. At the present time, the switches SWa to SWd whose first accesses after exit are determined by the control registers Ra to Rd are again switched to OFF state. Accordingly, when the same address is accessed for the second or more time after exit, the MWD switch unit 53 corresponding to the word line at that time is returned to the normal operation, the switches SWa to SWd are changed to OFF states, and thus only one word line is selected and driven at the time of access.

By employing the above modification, in a state in which 1 bit is held in a plurality of memory cells (the copy source and the copy destination on the same pair of bit lines are included), even if data of a specific memory cell (e.g., one of 16 memory cells for example) is destroyed in the self-refresh operation, such data can be repaired at the time of exit. That is, at the time of first access after exit, since a plurality of word lines (e.g., 16 word lines) are selected at the same time, data based on the accumulated charge of another normal memory cell is amplified by the sense amplifier SA and restored (rewritten) to the memory cell whose data has destroyed. When the word line is accessed for the second time, since the data is already repaired, the process may be returned to the normal control and only one word line may be selected. According to the modification, there is a merit that it becomes unnecessary to carry out the self-refresh with respect to the entire memory array 10 after exit, and the process can swiftly be shifted to the normal operation of the DRAM.

Second Embodiment

Figure 22:
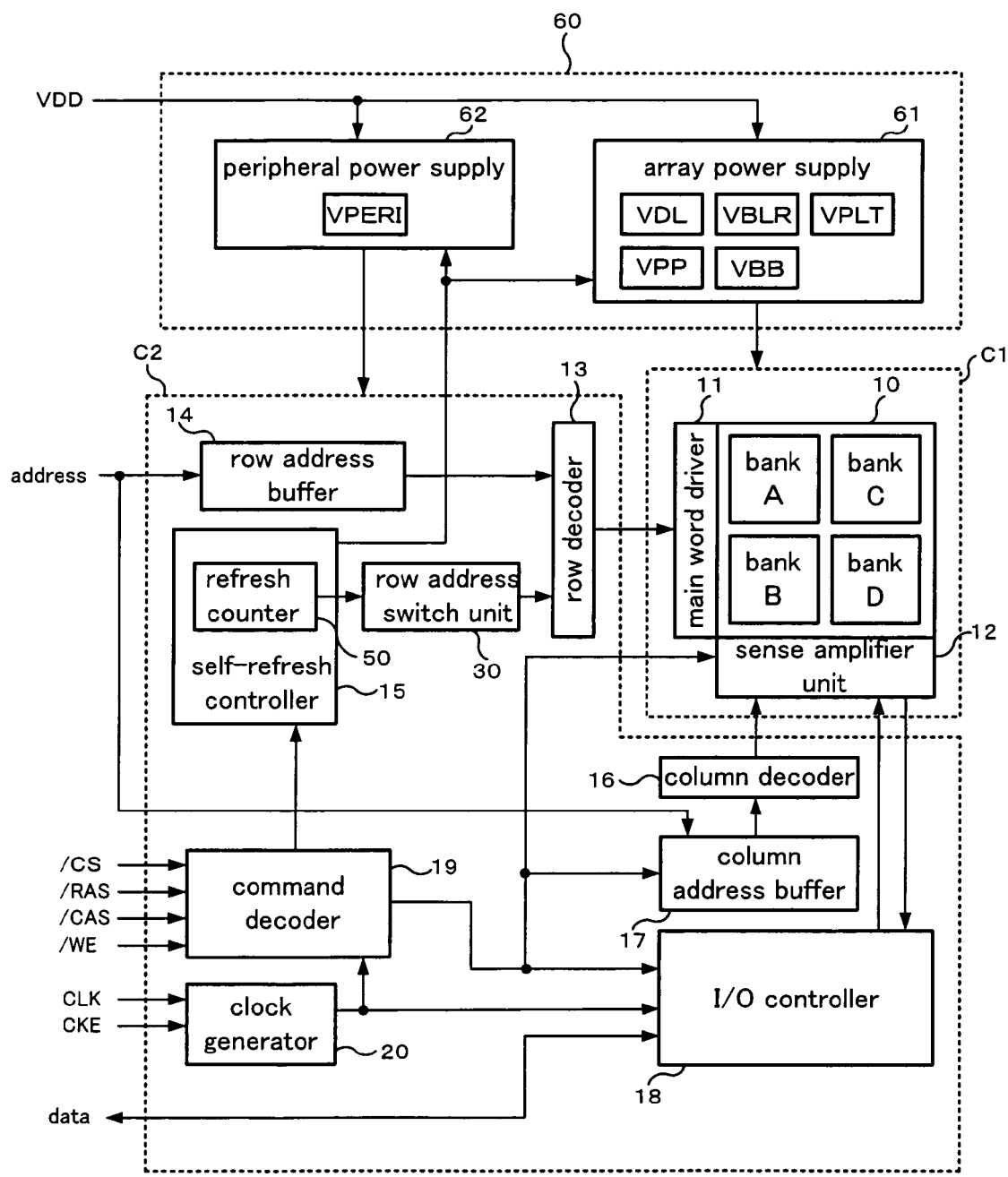
FIG. 22 is a block diagram showing the entire configuration of the DRAM of the second embodiment.

Next, FIG. 22 is a block diagram showing the entire configuration of a DRAM of a second embodiment which controls the switching operation of the supply voltage in the self-refresh. The entire circuit of the DRAM of the second embodiment is roughly divided into two portions, i.e., an array circuit C1 and a peripheral circuit C2. Basic configurations of the array circuit C1 and the peripheral circuit C2 are common to the DRAM of the first embodiment. In FIG. 22, constituent elements which are common to FIG. 1 are designated with the same numbers.

In the DRAM of the second embodiment, in addition to the above facts, a power supply unit 60 which generates a supply voltage required for operations of the array circuit C1 and the peripheral circuit C2 and supplies the same to various portions is provided. The power supply unit 60 includes an array power supply 61 which generates supply voltages (array voltages) to be supplied to the array circuit C1, and a peripheral power supply 62 which generates supply voltages (peripheral voltages) to be supplied to the peripheral circuit C2.

External supply voltage VDD is supplied to the power supply unit 60 from outside, and the external supply voltage VDD is stepped up or down to generate a predetermined supply voltage. In this embodiment, control signals are sent to the power supply unit 60 from a power supply controller 72 (FIG. 24) of the self-refresh controller 15, and switching control of power-up (power supplying)/power-down (power suspension) of the supply voltage for the array circuit C1 and the peripheral circuit C2 is carried out. Details of the power supply control method of the second embodiment will be described later.

Array voltages generated by the array power supply 61 include a word line voltage VPP for driving word lines, a bit line voltage VDL for driving bit lines, a precharge voltage VBLR for precharging bit lines, a substrate voltage VBB for supplying to a semiconductor substrate of the DRAM, and a plate voltage VPLT which is supplied to one of electrodes of the capacitors of the memory cells. Generally, the word line voltage VPP is generated by stepping up the external supply voltage VDD, and the bit line voltage VDL, the precharge voltage VBLR and the plate voltage VPLT are generated by stepping down the external supply voltage VDD, and the substrate voltage VBB is generated as a negative voltage. The peripheral voltages generated by the peripheral power supply 62 include, for example, a peripheral voltage VPERI generated by stepping down the external supply voltage VDD.

In the second embodiment, since configuration and operation explained based on FIGS. 2 to 6 of the first embodiment are common, explanation thereof will be omitted. Next, the self-refresh operation executed in the DRAM will be explained with reference to FIGS. 23 to 30. In the second embodiment, two configuration examples (configuration example A and B) having different control methods of the power supply will be explained.

Figure 23:
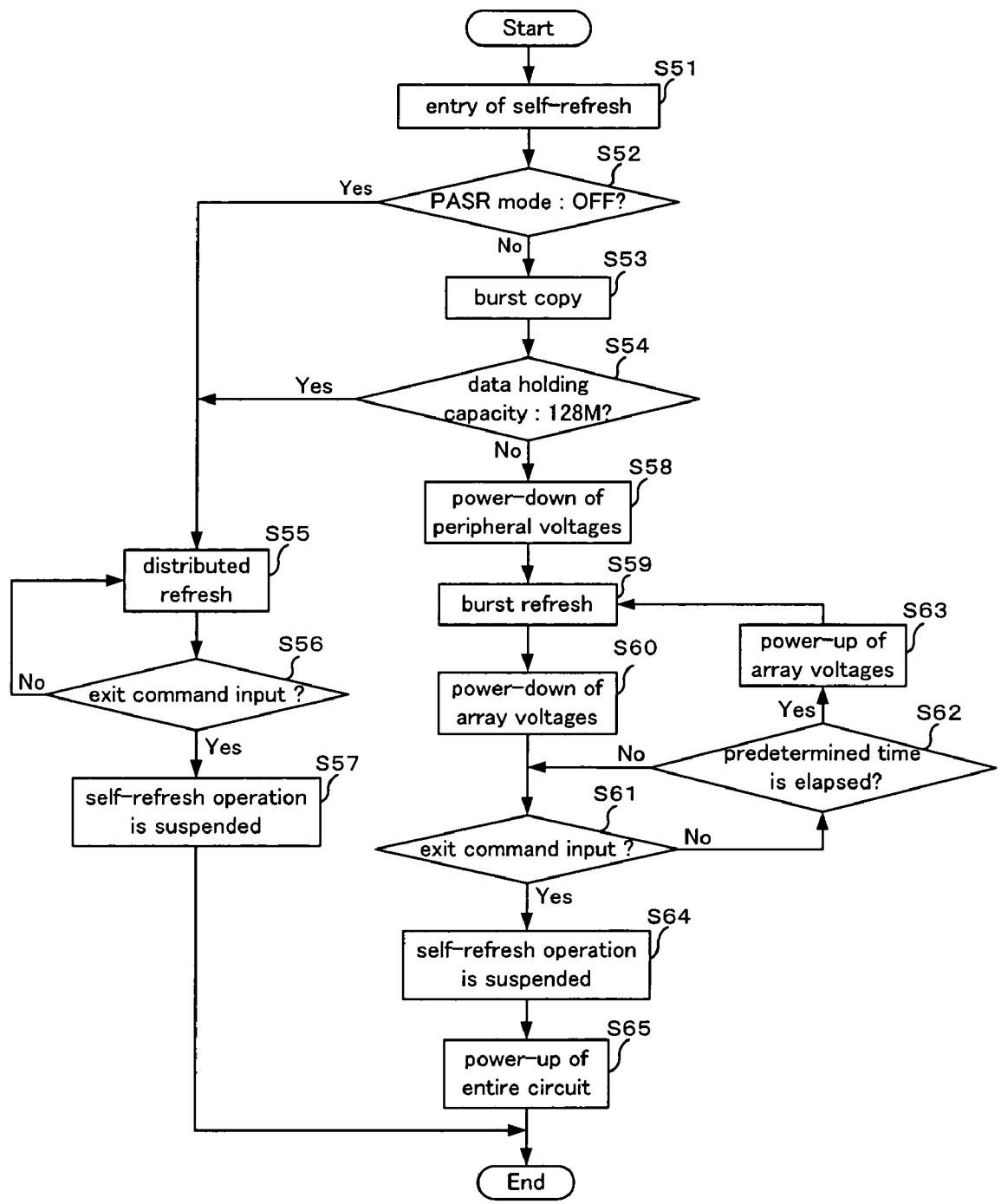
FIG. 23 is a flowchart for explaining control flow of the self-refresh of the second embodiment.
Figure 24:
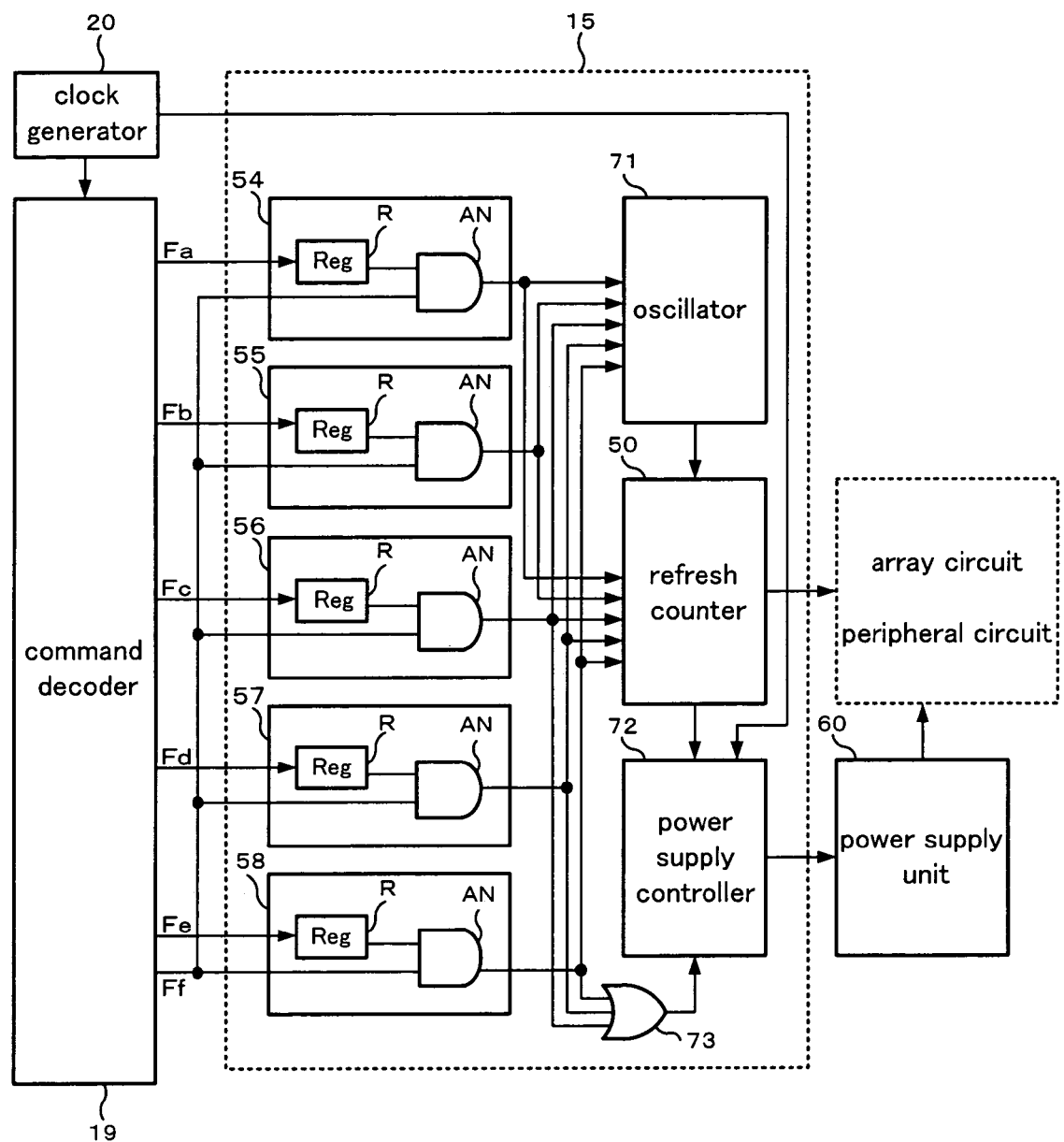
FIG. 24 is a diagram showing an example of the circuit configuration of the self-refresh controller and its peripheral portion of the second embodiment.
Figure 29:
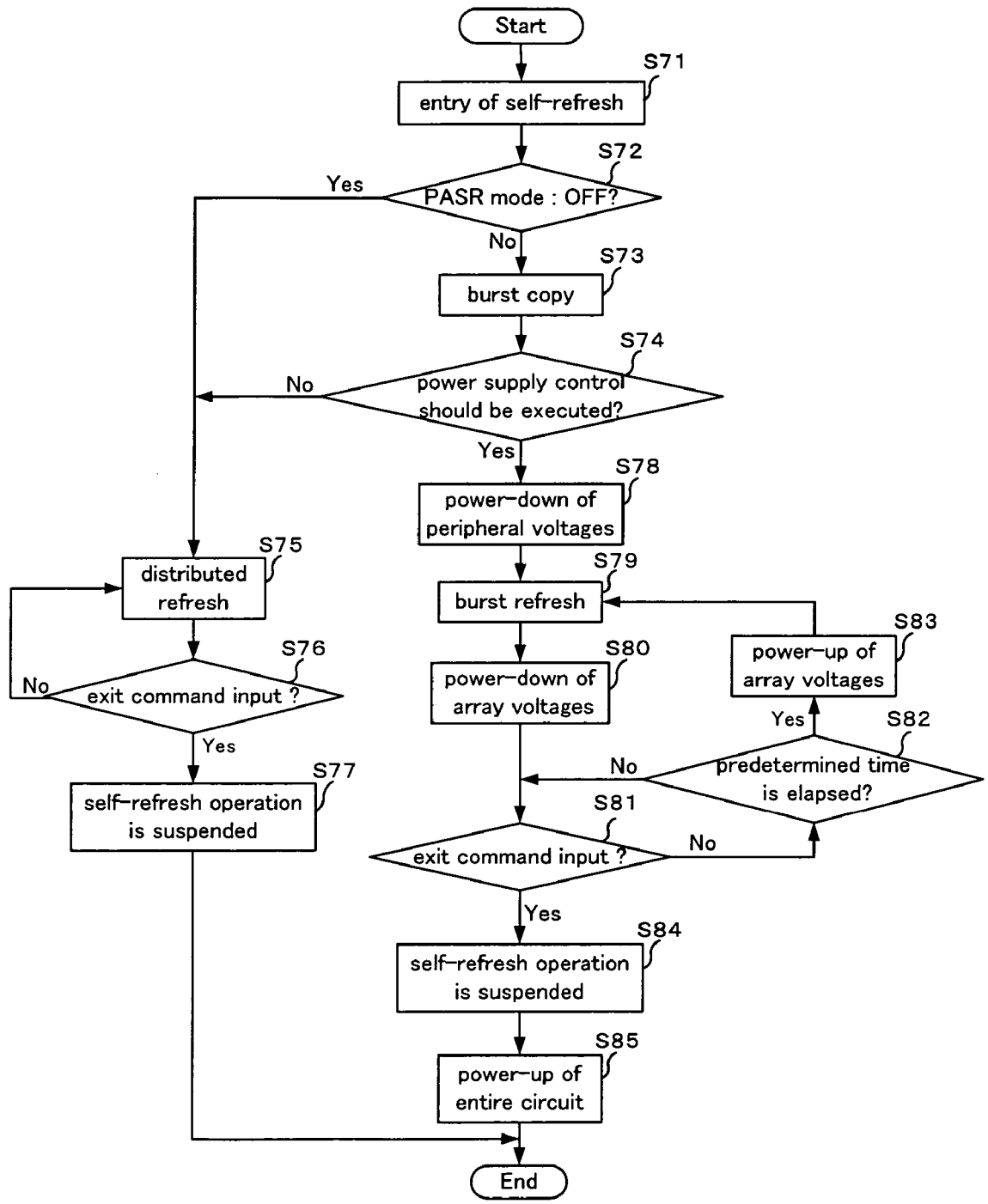
FIG. 29 is a flowchart for explaining control flow of the self-refresh of the modification of the second embodiment.
Figure 30:
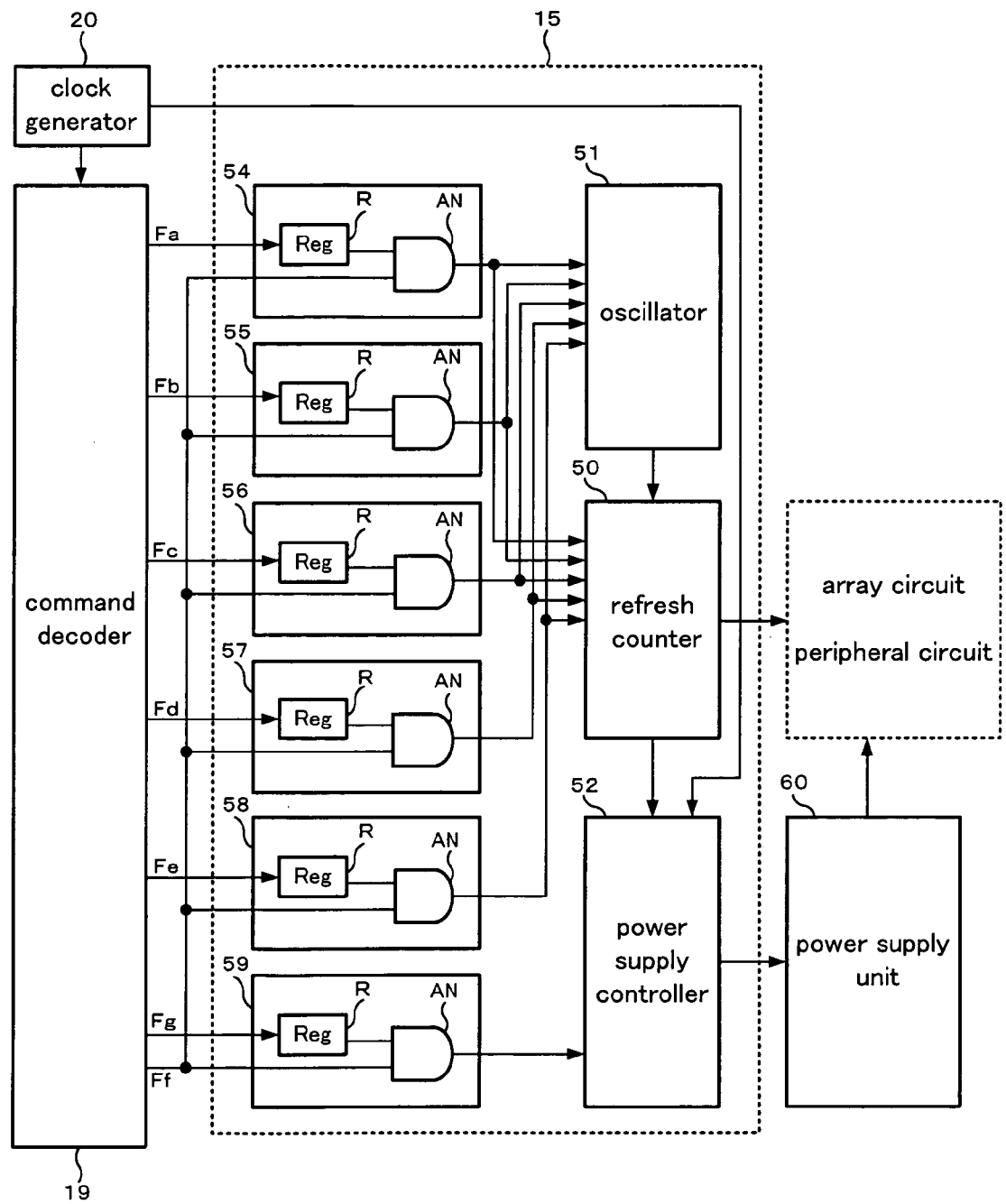
FIG. 30 is a diagram showing an example of the circuit configuration of the self-refresh controller and its peripheral portion of the modification of the second embodiment.

Here, FIG. 23 shows a flowchart for explaining control flow of the self-refresh in the configuration example A. FIG. 24 shows an example of the circuit configuration of the self-refresh controller 15 and its peripheral portion in the configuration example B. FIGS. 25 to 28 show concrete examples of a voltage generating circuit in the power supply unit 60. FIG. 29 shows a flowchart for explaining control flow of the self-refresh in the configuration example B. FIG. 30 shows an example of the circuit configuration of the self-refresh controller 15 and its peripheral portion in the configuration example B.

First, the configuration example A will be explained. In FIG. 23, in a state in which a mobile device is operated with low power consumption in the standby mode of the mobile device, the entry command of the self-refresh is input as a control command to the DRAM, and the self-refresh operation is started (entry) (step S51). At this time point, it is assumed that predetermined information concerning the PASR mode is already set in the setting register.

Next, information of the setting register is referred to, a setting state of ON/OFF of the PASR mode is discriminated. If the PASR mode is set OFF (step S52; Yes), the process is shifted to step S55. If the PASR mode is set ON (step S52; No), the burst copy from the holding area (copy source) to the copy area (copy destination) is executed (step S53). When the burst copy is executed, control is performed such that all of the word lines in the holding area are collectively controlled sequentially.

In the burst copy of step S53, the number of times of the driving operations of the word lines is different in accordance with the data holding capacity. That is, in the holding area, 4096 word lines (when the data holding capacity is set to 128 Mbits), 2048 word lines (when the data holding capacity is set to 64 Mbits), 1024 word lines (when the data holding capacity is set to 32 Mbits), and 512 word lines (when the data holding capacity is set to 16 Mbits) are selected and driven sequentially in accordance with the data holding capacity, and the corresponding word lines in the copy area are selected and driven in accordance with a later-described technique. Thereby, data is held in 2, 4, 6, 8 or 16 memory cells per 1 bit.

And if the data holding capacity is set to 128 Mbits in the setting register (step S54; Yes), the process is shifted to step S55. If the data holding capacity is set to other value, i.e., 64 Mbits, 32 Mbits, 16 Mbits (step S54; No), the process is shifted to step S58.

If the process is shifted to step S55 from step S52 or 54, the row address is counted up by the refresh counter 50, the word lines are selected and driven at constant intervals sequentially to execute the distributed refresh (step S55). When the PASR mode is OFF, 8192 word lines of the memory array 10 are selected and driven sequentially, and when the data holding capacity is set to 126 Mbits, 4096 word lines in the holding area are selected and driven sequentially, and at the same timing 4096 word lines in the copy area are selected and driven. When the distributed refresh is executed, control is performed such that the intervals between the refresh operations of the word lines become equal to each other.

Next, when the exit command of the self-refresh is input as a control command at predetermined timing during execution of the distributed refresh (step S56; Yes), the self-refresh operation is suspended (exit) (step S57). Thereafter, the process is shifted to the normal operation of the DRAM (read or write). When the exit command is not input (step S56; No), the distributed refresh in step S55 is executed continuously.

On the other hand, if the process is shifted to step S58 from step S54, power-down control of the peripheral supply voltage (peripheral voltage VPERI) which is supplied to a circuit portion of the peripheral circuit C2 is performed by the peripheral power supply 62 (step S58). Thereafter, current flowing through the peripheral circuit C2 is largely reduced because the power supply to the circuit portion is suspended.

Here, in the peripheral circuit C2, as the circuit portion for which the power supply is maintained, there are a refresh controller 15 which operates in the self-refresh, a command decoder 19 and a clock generator 20. For other circuit portions included in the peripheral circuit C2, the power supply is suspended in accordance with step S58.

Then, the burst refresh is executed at predetermined refresh intervals (step S59). In step S59, the word lines in the holding area are selected and driven sequentially, the corresponding word lines in the copy area are selected and driven at the same timing, thereby holding data in the entire memory array 10. When the burst refresh is executed, control is performed such that all of the word lines in the holding area are collectively selected and driven sequentially.

In the burst refresh in step S59, like step S53, the number of times of the driving operations of the word lines is different in accordance with the data holding capacity. That is, in the holding area, 4096 word lines (when the data holding capacity is set to 128 Mbits). 2048 word lines (when the data holding capacity is set to 64 Mbits), 1024 word lines (when the data holding capacity is set to 32 Mbits), and 512 word lines (when the data holding capacity is set to 16 Mbits) are selected and driven sequentially in accordance with the data holding capacity, and the corresponding word lines in the copy area are selected and driven at the same timing. Thereby, data in the entire memory array 10 is held.

Next, when one time burst refresh is completed, the power-down control of the array voltages supplied to the array circuit C1 is carried out by controlling the array power supply 61 (step S60). When the exit command of the self-refresh is input as a control command at predetermined timing (step SS61; Yes), the self-refresh operation is suspended (exit) (step S64). Thereafter, the process is shifted to the normal operation of the DRAM (read or write). When the exit command is not input (step S61; No), it is monitored whether a predetermined time is elapsed, and if the predetermined time is not elapsed (step S62; No), the process is returned to step S61.

The predetermined time in step S62 corresponds to the suspension period in which the burst refresh is suspended in one refresh period. That is, the operation period and the suspension period of the burst refresh are alternately repeated, and they are combined so that continuous operation is carried out with constant refresh period. When the predetermined time is elapsed (step S62; Yes), the power-up control of the array voltages supplied to the array circuit C1 is carried out by controlling the array power supply 61 (step S63) and the process is returned to step S59. Thereafter, the burst refresh in step S59 is periodically repeated, and the power supply to the array circuit C1 which is in association therewith is intermittently controlled.

By repeating the controls of steps S59 to S63, since the operation period of the burst refresh is sufficiently shorter than the suspension period, the current consumption of the array circuit C1 can largely be reduced.

Next, after step S64, the power-up control of the entire circuit including the array circuit C1 and the peripheral circuit C2 is carried out by controlling the array power supply 61 and the peripheral power supply 62 (step S65). Thereby, the process is shifted to the normal operation of the DRAM after returning to the normal power supply control.

The configuration example A controlled in accordance with the above flowchart, the circuit configuration shown in FIG. 24, for example, is realized. In FIG. 24, as an essential portion related to the self-refresh operation of the DRAM, the self-refresh controller 15 which controls the states of the row address and supply voltages by the command of the command decoder 19 is shown together with peripheral constituent elements.

In FIG. 24, the command decoder 19 sends control flags Fa, Fb, Fc, Fd, Fe and Ff to the self-refresh controller 15 in accordance with the setting contents of the PASR mode and the data holding capacity in the setting register. The control flag Fa shows that the PASR mode is OFF (data holding capacity is 256 Mbits). Concerning the setting of the data holding capacity, the control flag Fb shows 128 Mbits, the control flag Fc shows 64 Mbits, the control flag Fd shows 32 Mbits and the control flag Fe shows 16 Mbits. The control flag Ff shows that the self-refresh operation is being executed (from entry to exit). The self-refresh controller 15 includes a refresh counter 50 for counting the row address which are subjected to the self-refresh, and oscillator 71 for oscillating a reference signal of predetermined frequency and for supplying the same to the refresh counter 50, a power supply controller 72 for operating power-up or power-down operation of the power supply unit 60, and OR circuit 73, and five PASR switches 54 to 58.

Each of the five PASR switches 54 to 58 comprises an AND circuit AN and a control register R which holds the control flags Fa to Fe. In the PASR switch 54, the control flag Fa is input to the register R, and an output of the register R and the control flag Ff are input to the AND circuit AN. Thereby, in a state in which the data holding capacity is set to 256 Mbits and the self-refresh operation is being executed, the PASR switch 54 sends the control signal to the oscillator 71 and the refresh counter 50, and the control is performed such that the oscillation frequency of the reference signal and the counting range of the row addresses suit for the data holding capacity of 256 Mbits.

Similarly, the control flags Fb to Fe and the control flag Ff are input to each of the other PASR switches 55 to 58, and the control signal is sent to the oscillator 71 and the refresh counter 50. Control is performed such that the oscillation frequency of the reference signal and the counting range of the row addresses suit for the data holding capacities of 128 Mbits, 64 Mbits, 32 Mbits and 16 Mbits, respectively.

Control signals are input to the OR circuit 73 from the three PASR switches 56, 57 and 58, and OR output of the three signals are sent to the power supply controller 72. The power supply controller 72 sends a control signal to the power supply unit 60 to command power-up or power-down operation at predetermined timing based on the counted value of the refresh counter 50 and the OR output from the OR circuit 73. In this case, power-down control of the peripheral power supply 62 is performed during the self-refresh operation, and power-down and power-up control of the array power supply 61 are repeated in synchronization with the refresh period. Such power supply control is performed only in three states, i.e., states in which data holding capacities corresponding to the inputs of the OR circuit 73 are 64 Mbits, 32 Mbits and 16 Mbits. Thereby, the power supply control shown in the flowchart of FIG. 23 can be performed.

Here, since it is necessary to generate the plurality of supply voltages in accordance with purposes as described above, a plurality of voltage generating circuits suitable for respective supply voltages are included in the power supply unit 60. There are various possible concrete examples of such a voltage generating circuit. Four typical concrete examples of the voltage generating circuit will be explained.

Figure 25:
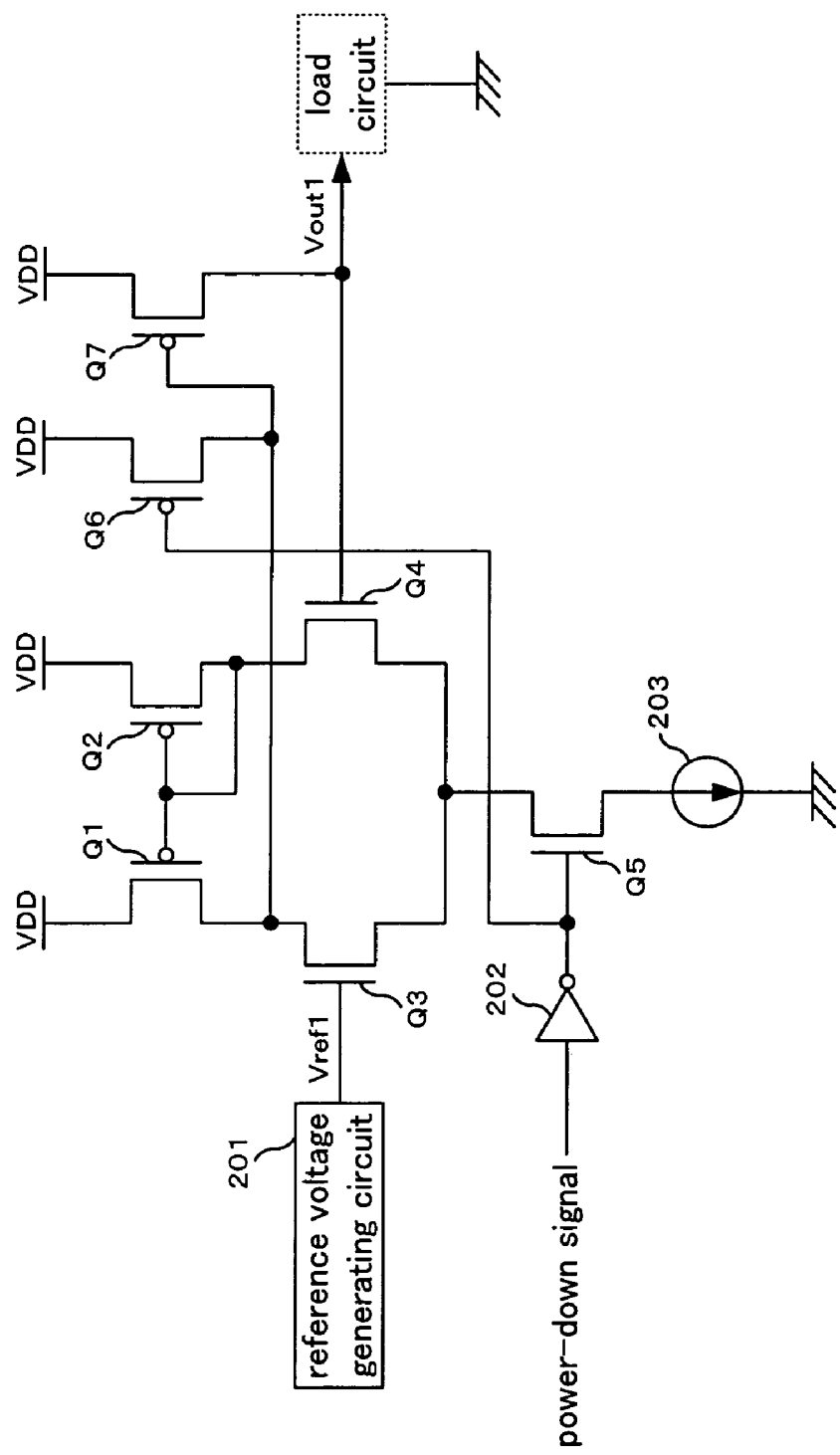
FIG. 25 shows a configuration example of a first voltage generating circuit which steps down the external supply voltage VDD to generate an output voltage Vout1 in the second embodiment.

FIG. 25 shows a configuration example of a first voltage generating circuit which steps down the external supply voltage VDD to generate an output voltage Vout1. The first voltage generating circuit is used as a generating circuit of bit line voltage VDL and a generating circuit of the peripheral supply voltage VPERI. The first voltage generating circuit shown in FIG. 25 includes a pair of PMOS transistors Q1 and Q2, a pair of NMOS transistors Q3 and Q4, a NMOS transistor Q5, PMOS transistors Q6 and Q7, a reference voltage generating circuit 201, an inverter 202 and a current source 203. In the first voltage generating circuit, and the output voltage Vout1 is supplied to a load circuit on the output side.

In the power supply operation, in a state in which a reference voltage Vref1 which is output from the reference voltage generating circuit 201 is applied to a gate of the NMOS transistor Q3, the output voltage Vout1 connected to a gate of the NMOS transistor Q4 is changed following the reference voltage Vref1 by effect of the MOS transistors Q1 to Q5 of the differential structures and the constant current source 203. In the self-refresh operation, a power-down signal is supplied from the power supply controller 72, and the signal is changed to high at the time of power-down control, while is changed to low at the time of power supply control.

First, when the power-down signal is low, gates of the NMOS transistor Q5 and the PMOS transistor Q6 become high through the inverter 202, the NMOS transistor Q5 is brought into ON state and the PMOS transistor Q6 is brought into OFF state. In this case, the MOS transistors Q1 to Q5 are normally operated, drain voltage of the NMOS transistor Q3 is applied to a gate of the PMOS transistor Q7, the PMOS transistor Q7 is brought into ON state, and the output voltage Vout1 is supplied to the load circuit.

On the other hand, when the power-down signal is high, the gates of the NMOS transistor Q5 and the PMOS transistor Q6 become low, the NMOS transistor Q5 is brought into OFF state and the PMOS transistor Q6 is brought into ON state. In this case, since the constant current is not supplied from the constant current source 203, the MOS transistors Q1 to Q5 stop working, the gate of the PMOS transistor Q7 becomes high through the PMOS transistor Q6 and the PMOS transistor Q7 is brought into OFF state, and the supply of the output voltage Vout1 to the load circuit is suspended.

Figure 26:
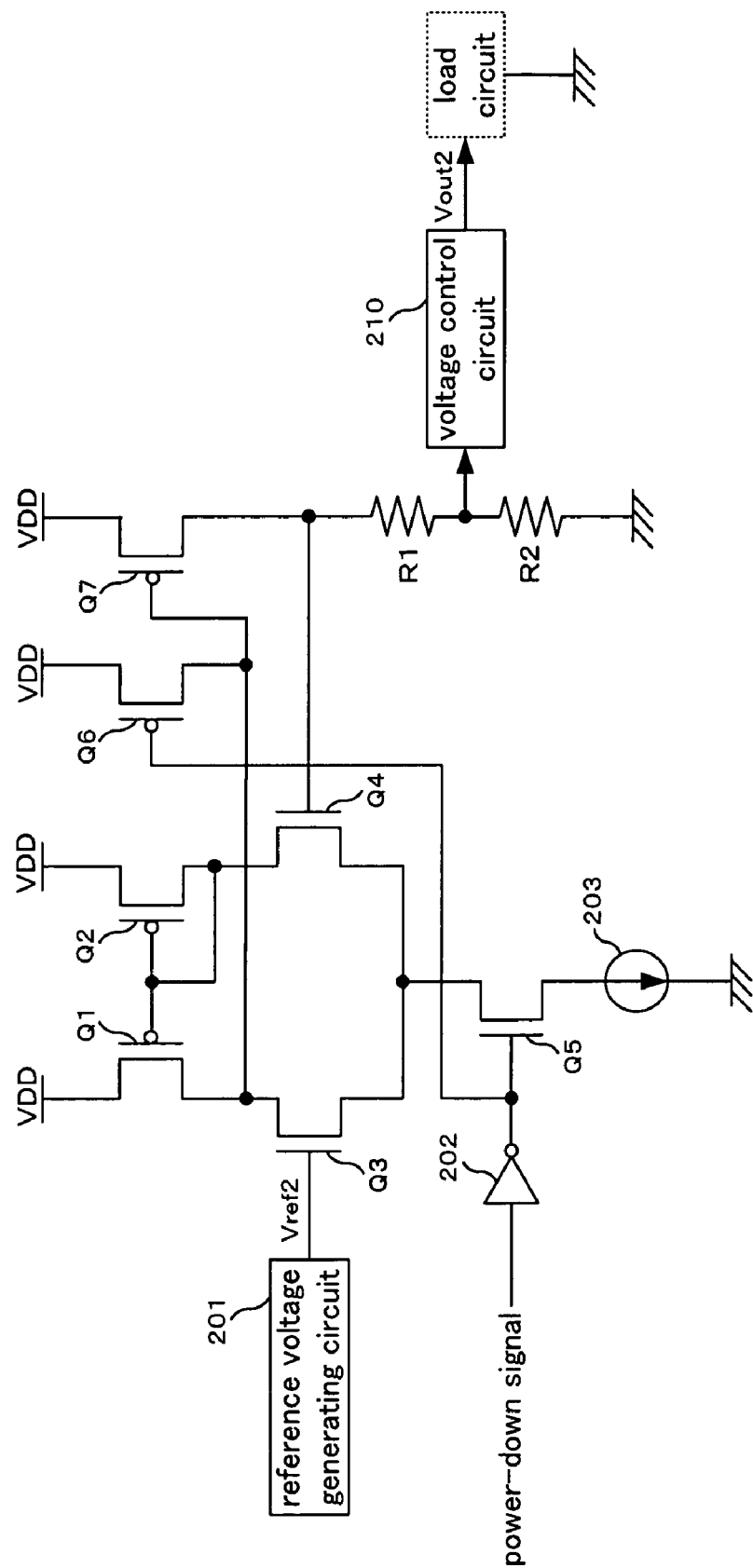
FIG. 26 shows a configuration example of a second voltage generating circuit which generates relatively low output voltage Vout2 based on the external supply voltage VDD in the second embodiment.

Next, FIG. 26 shows a configuration example of a second voltage generating circuit which generates relatively low output voltage Vout2 based on the external supply voltage VDD. The second voltage generating circuit is used as a generating circuit of the precharge voltage VBLR and a generating circuit of the plate voltage VPLT. The second voltage generating circuit shown in FIG. 26 has the same structure as that of the first voltage generating circuit, but the second voltage generating circuit further includes resistors R1 and R2 connected to the output side and a voltage control circuit 210.

In the power supply operation, gate voltage of the NMOS transistor Q4 is changed following the reference voltage Vref2 in accordance with the same effect as that shown in FIG. 25, The gate voltage of the NMOS transistor Q4 is divided by the resistors R1 and R2, the divided voltage is input to the voltage control circuit 210, and stabilized output voltage Vout2 is supplied to a load circuit. Thus, by appropriately selecting the two resistors R1 and R2, a value of the output voltage Vout2 can be adjusted.

In FIG. 26, the power-down signal in the self-refresh operation is controlled in the same manner as the first voltage generating circuit. When the power-down signal is low, the MOS transistors Q1 to Q5 are normally operated in accordance with the same operation as that shown in FIG. 25, the PMOS transistor Q7 is brought into ON state, current flows to the resistors R1 and R2, and the output voltage Vout2 is supplied to the load circuit. On the other hand, when the power-down signal is high, the MOS transistors Q1 to Q5 stop working in accordance with the same operation shown in FIG. 25, the PMOS transistor Q7 is brought into OFF state, current is not supplied to the resistors R1 and R2, and the supply of the output voltage Vout2 to the load circuit is suspended.

Figure 27:
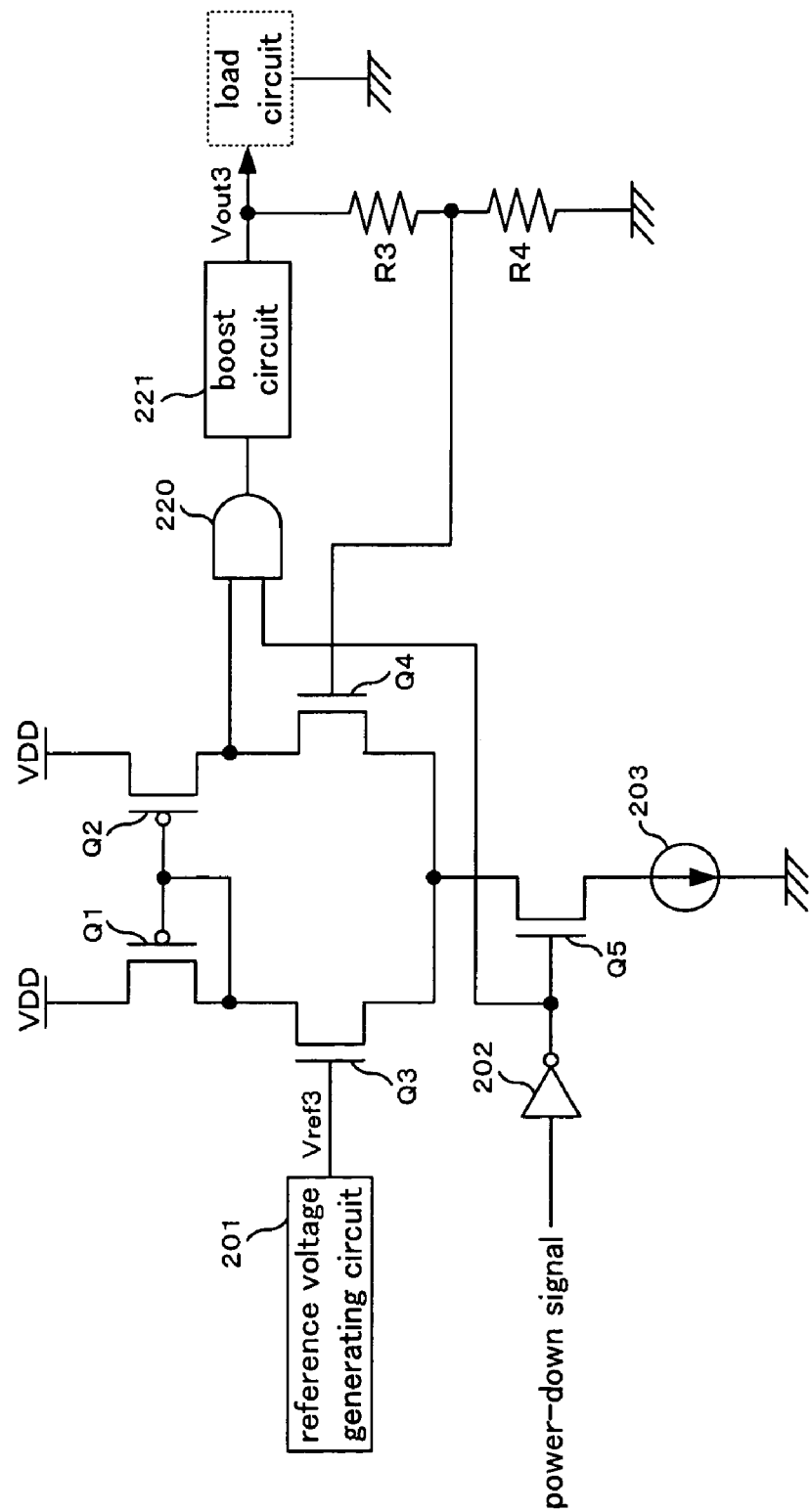
FIG. 27 shows a configuration example of a third voltage generating circuit which steps up the external supply voltage VDD to generate an output voltage Vout3 in the second embodiment.

Next, FIG. 27 shows a configuration example of a third voltage generating circuit which steps up the external supply voltage VDD to generate an output voltage Vout3. The third voltage generating circuit is used as a generating circuit of word line voltage VPP. In the third voltage generating circuit shown in FIG. 27, the PMOS or NMOS transistors Q1 to Q5, the reference voltage generating circuit 201, the inverter 202 and the current source 203 are substantially the same as those of the first and second voltage generating circuits, but the third voltage generating circuit further includes an AND circuit 220, a boost circuit 221 and resistors R3 and R4.

In the power supply operation, gate voltage of the NMOS transistor Q4 is changed following the reference voltage Vref3 in accordance with the same effect as that shown in FIGS. 25 and 26. The series resistors R3 and R4 are connected between the output side of the boost circuit 221 and the ground, and the gate of the NMOS transistor Q4 is connected to a node between the resistors R3 and R4. That is, the output voltage Vout3 has a voltage value which is equal to the reference voltage Vref3 multiplied by (R3+R4)/R4 is obtained by the boost circuit 221 which is a step up circuit by a charge pump, and the output voltage Vout3 is supplied to the load circuit. In this case, a value of the output voltage Vout3 can be adjusted by appropriately selecting the two resistors R3 and R4.

In FIG. 27, the power-down signal in the self-refresh operation is controlled in the same manner as those of the first and the second voltage generating circuits. Therefore, when the power-down signal is low, the MOS transistors Q1 to Q5 are normally operated, and high is input to one input terminal of the AND circuit 220. Thus, the AND circuit 220 can obtain an output in accordance with drain voltage of the PMOS transistor Q4, the boost circuit 221 is operated in accordance with the output, and the output voltage Vout3 is supplied to the load circuit. On the other hand, when the power-down signal is high, the MOS transistors Q1 to Q5 stop working, and low is input to the one input terminal of the AND circuit 220. Thus, the output of the AND circuit 220 becomes low, the operation of the boost circuit 221 is suspended, and the supply of the output voltage Vout3 to the load circuit is suspended.

Figure 28:
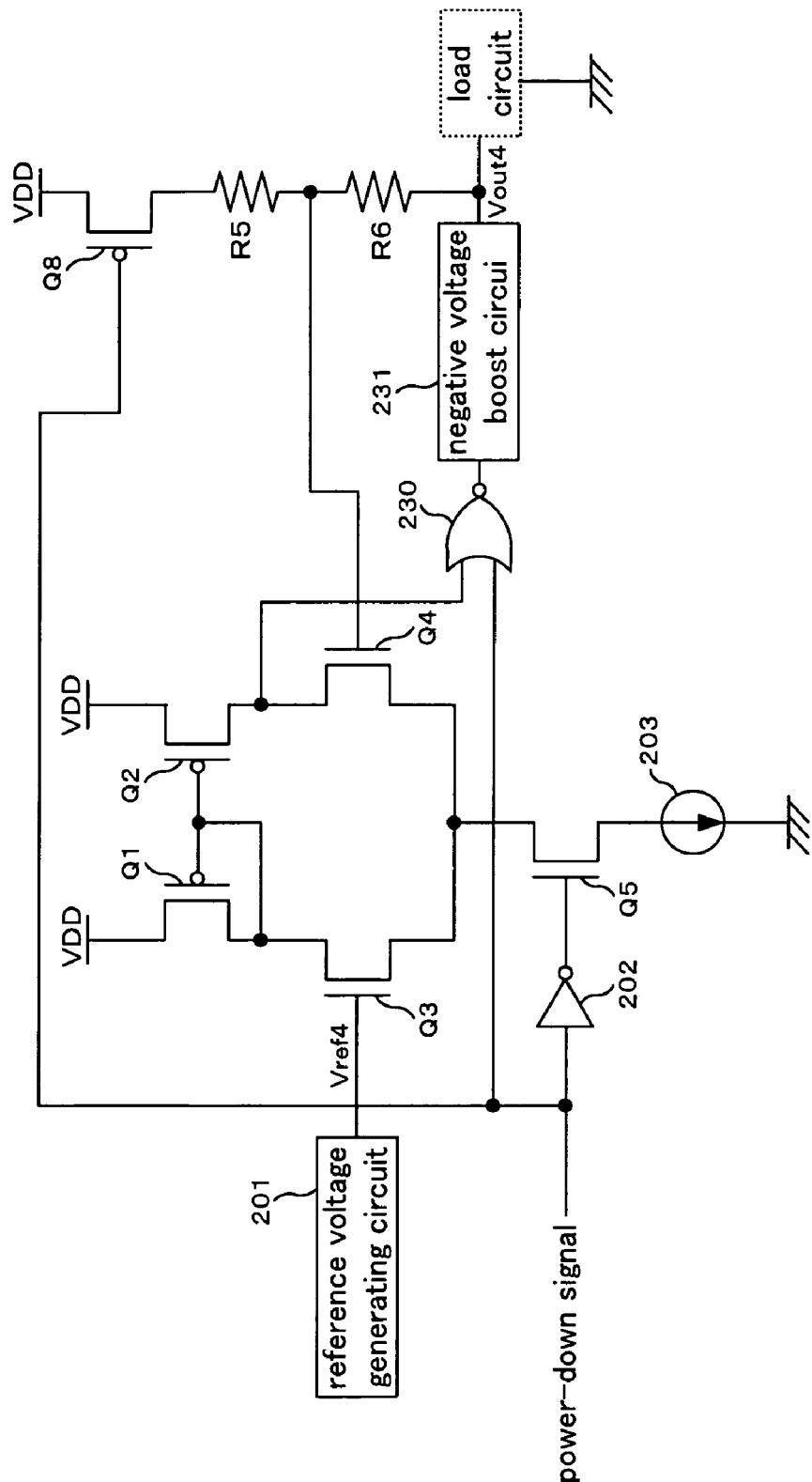
FIG. 28 shows a configuration example of a fourth voltage generating circuit which generates an output voltage Vout4 based on the external supply voltage VDD in the second embodiment.

Next, FIG. 28 shows a configuration example of a fourth voltage generating circuit which generates an output voltage Vout4 of negative voltage based on the external supply voltage VDD. The fourth voltage generating circuit is used as a generating circuit of substrate voltage VBB. In the fourth voltage generating circuit shown in FIG. 28, the PMOS or NMOS transistors Q1 to Q5, the reference voltage generating circuit 201, the inverter 202 and the current source 203 are substantially the same as those of the first to third voltage generating circuits, but the fourth voltage generating circuit further includes a NOR circuit 230, a negative voltage boost circuit 231, resistors R5 and R6 and a PMOS transistor Q8.

In the power supply operation, gate voltage of the NMOS transistor Q4 is changed following a reference voltage Vref4 in accordance with the same effect as that shown in FIGS. 25 to 27. The resistors R5 and R6 are connected in series with respect to the PMOS transistor Q8 between the external supply voltage VDD and the output side of the negative voltage boost circuit 231, and the gate of the NMOS transistor Q4 is connected to a node between the resistors R5 and R6. Based on such a configuration, the output voltage Vout4 having negative voltage level which is determined by a ratio of R5 and R6 and by the reference voltage Vref4 is obtained by the negative voltage boost circuit 231 which is a generating circuit of negative voltage by a charge pump, and the output voltage Vout4 is supplied to the load circuit. In this case, a value of the output voltage Vout4 can be adjusted by appropriately selecting the two resistors R5 and R6.

In FIG. 28, the power-down signal in the self-refresh operation is controlled in the same manner as those of the first to third voltage generating circuits. When the power-down signal is low, the MOS transistors Q1 to Q5 are normally operated, and low is input to one input terminal the NOR circuit 230. Thus, the NOR circuit 230 can obtain an output in accordance with drain voltage of the PMOS transistor Q4, the negative voltage boost circuit 231 is operated in accordance with the output, and the output voltage Vout4 is supplied to the load circuit. On the other hand, when the power-down signal is high, the MOS transistors Q1 to Q5 stop working, and high is input to the one input terminal of the NOR circuit 230. Thus, the output of the NOR circuit 230 becomes low, the operation of the negative voltage boost circuit 231 is suspended, and the supply of the output voltage Vout4 to the load circuit is suspended.

The circuit configuration shown in each of FIGS. 25 to 28 is one example, and voltage generating circuits having various configurations may be used in accordance with a purpose. It is preferable that a voltage generating circuit is constituted by employing a circuit configuration which is suitable for magnitude of desired voltage value and current value to be secured. A plurality of voltage generating circuits may be provided for the same kind of supply voltage.

Power supply control during self-refresh in the above-explained configuration example A is not performed when the data holding capacity is large (256 Mbits, 128 Mbits), and is performed only when the data holding capacity is small (64 Mbits), 32 Mbits, 16 Mbits). With this configuration, when the data holding capacity is set small for suppressing the current consumption in the standby mode of the DRAM, if the power supply control effect is added, the current consumption can remarkably be reduced.

Although the power supply control is suspended when the data holding capacity is 128 Mbits or higher in this configuration, this value is not limited to 128 Mbits, and the value may freely be changed.

Next, the configuration example B will be explained. In a flowchart shown in FIG. 29, the processes in steps S71 to S73 are the same as those in steps S51 to S53 in FIG. 23, explanation thereof will be omitted. In FIG. 29, the power supply control is not switched in accordance with the data holding capacity after the burst copy is completed, but user previously sets whether or not the power supply should be controlled. Thus, in step S74, a power supply control flag showing presence or absence of the power supply control is referred to, and when it is set that power supply control should not be performed (step S74; No), the process is shifted to step S75, and when it is set that the power supply control should not be performed (step S74; Yes), the process is shifted to step S78. Processes thereafter are the same as those in steps S55 to 65 in FIG. 23, and thus explanation thereof will be omitted.

The configuration example B controlled in accordance with the above-described flowchart is realized by a circuit configuration shown in FIG. 30. FIG. 30 shows the self-refresh controller 15 together with peripheral constituent elements thereof, as in FIG. 24. The command decoder 19 sends the power supply control flag Fg to the refresh controller 15 in addition to the control flags Fa, Fb, Fc, Fd, Fe and Ff as in FIG. 24.

As compared with FIG. 24, the self-refresh controller 15 is not provided with the OR circuit 73, but is provided with a PASR switch 59 in addition to the PASR switches 54 to 58. Each of the PASR switches 54 to 59 includes a control register R and an AND circuit AN as in FIG. 24. Control flags Fa to Fe and a control flag F are input to the PASR switches 54 to 58, and a power supply control flag Fg is input to a register R of the PASR switch 59. Therefore, when the power supply control flag Fg shows that the power supply should be controlled and the self-refresh operation is being executed, the PASR switch 59 sends the control signal to the power supply controller 72 and with this, power-up or power-down operation is commanded to the power supply unit 60.

It is preferable that 1 bit in the setting register shown in FIG. 5 is allocated for the power supply control flag Fg, and user can freely set. Thereby, the power supply control flag Fg can selectively be set into a state of control or a state without control in accordance with using state of the DRAM, and it is possible to realize convenient control.

The power supply control during the self-refresh in the above-explained configuration example B is executed independently from the setting operation of the data holding capacity, it is possible to select whether the power supply should be controlled such as to meet the using state of the DRAM, and it is possible to realize convenient control.

In the partial array self-refresh of the second embodiment, since the concrete configuration, the operation and the effect explained based on FIGS. 5 to 19 in the first embodiment are basically the same, and thus explanation thereof will be omitted. Here, the current consumption reduction effect when the power supply control is carried out which is feature of the second embodiment will be explained.

Figure 31:
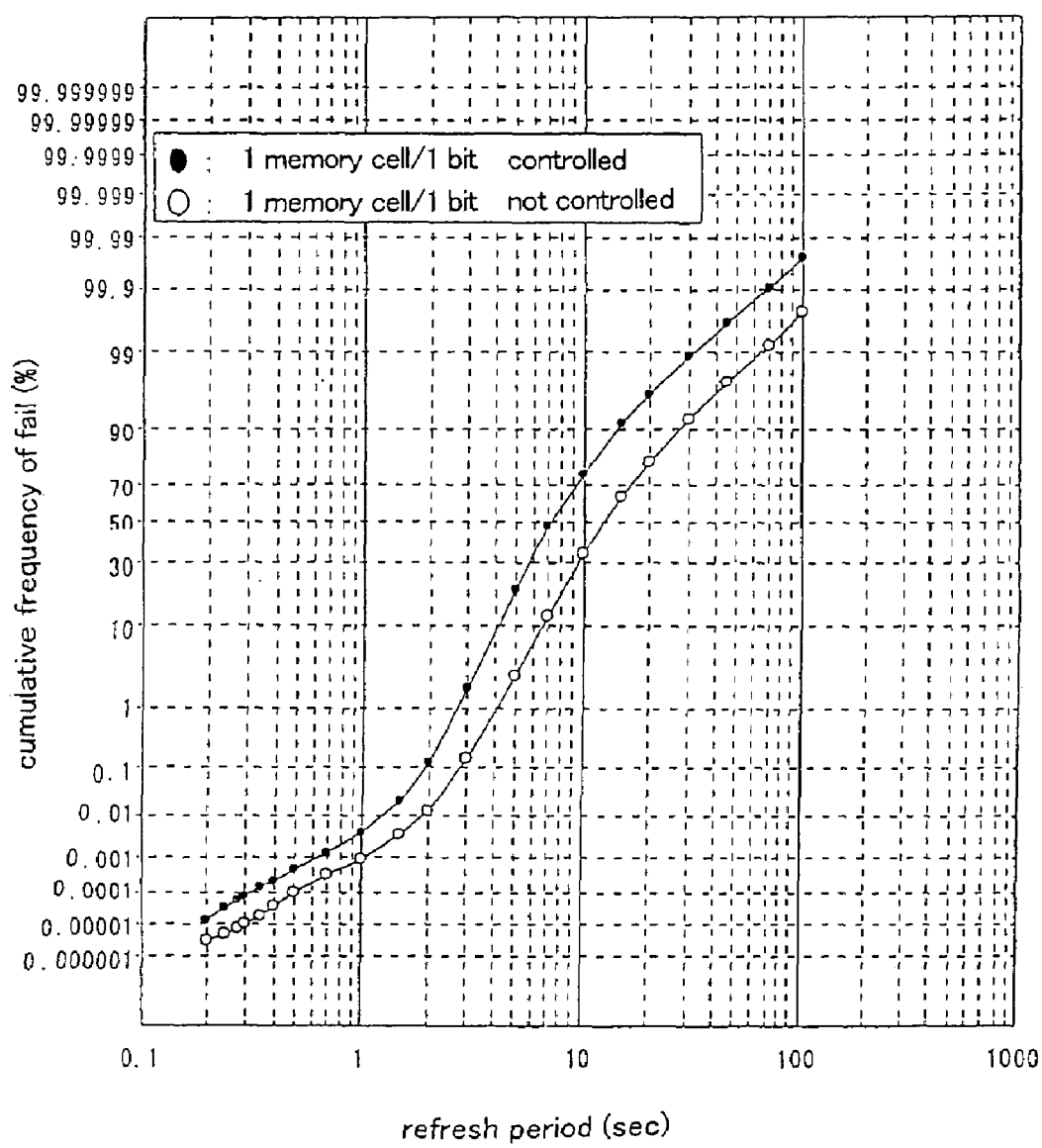
FIG. 31 is a graph showing a difference whether the power supply is controlled or not in the case of 1 memory cell/1 bit concerning a relation between cumulative frequency of fail and the refresh period (the same as that shown in FIG. 18) in the second embodiment.

FIG. 31 is a graph showing a difference whether the power supply is controlled or not in the case of 1 memory cell/1 bit concerning a relation between cumulative frequency of fail and the refresh period that is the same as that shown in FIG. 18. It can be found that the graph when the power supply control is not carried out is the same as the graph of 1 memory cell/1 bit shown in FIG. 18, but in a graph when the power supply control is carried out, the cumulative frequency of fail is further reduced over a wide range of the refresh period. That is, it can be confirmed that if the power supply control is performed, there is an effect that the retention time can be increased under the same condition. Such an effect is based on reduction of leak charge which stored in memory cells due to following two reasons. The first reason is that the voltage reduction of the memory cell by the power supply control causes the chip temperature to fall. The second reason is that since the potential difference between the diffusion layer of the memory cell and the diffusion layer of the substrate layer is reduced, the electric field is relaxed.

Next, the effect of the power supply control when the data holding capacity (the number of memory cells per 1 bit) is increased will be explained using FIGS. 32 and 33. FIG. 32 shows variation in current in accordance with the presence or absence of the power supply control when the data holding capacity is varied. In FIG. 32, it is assumed that an appropriate refresh period suitable for each data holding capacity is set, and FIG. 32 shows measured values of currents suitable for the presence or absence of the power supply control in these states. Here, the refresh operation current is current consumption caused by the refresh operation of the power supply unit 60 after supply voltage required for the refresh operation is supplied, and thus the refresh operation current is constant irrespective of the presence or absence of the power supply control. On the other hand, the number of memory cells per 1 bit is increased, the refresh operation current is reduced based on the above effect.

On the other hand, since the power supply circuit current is a DC circuit by supply voltages generated by the power supply unit 60, the power supply circuit current is a current value which has nothing to do with the number of memory cells per 1 bit. However, the power supply circuit current when current control is not performed is 20 μA, whereas the power supply circuit current when power supply control is performed is 5 μA, and it can be found that the power supply circuit current is reduced to ¼ by execution of the power supply control. This is because that when the power supply is controlled, a portion of the peripheral power supply is suspended during the self-refresh and the array voltage is intermittently suspended, and thus the current is reduced correspondingly.

The self-refresh current consumed by the DRAM in the self-refresh operation is equal to a sum of the refresh operation current and the power supply circuit current. As shown in FIG. 32, when the power supply is controlled, as compared with a case in which the power supply is not controlled, the self-refresh current can be reduced by 15 μA which is a difference of power supply circuit current.

Figure 33:
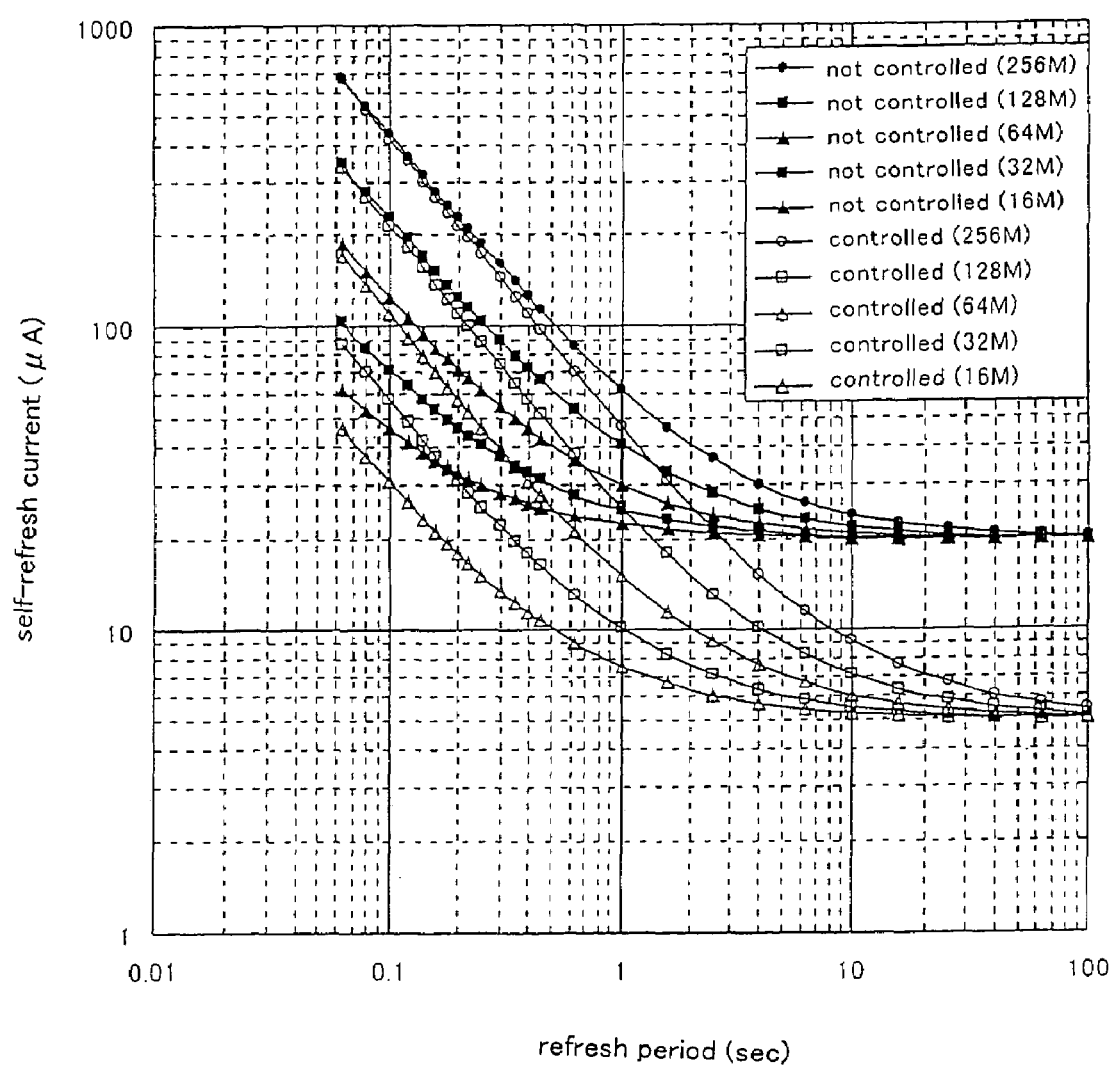
FIG. 33 is a graph showing a relation between the refresh period and the self-refresh current in accordance with the presence and absence of the power supply control and the data holding capacity.

FIG. 33 is a graph showing a relation between the refresh period and the self-refresh current in accordance with the presence and absence of the power supply control and the data holding capacity. FIG. 33 is obtained by plotting detailed data corresponding to the self-refresh current shown in FIG. 32. As can be found from FIG. 33, as the data holding capacity is reduced and the refresh period is set longer, the self-refresh current can be reduced, and the self-refresh current can further be reduced by executing the power supply control. At that time, a difference in self-refresh current in accordance with the presence or absence of the power supply control is increased in an area where the refresh period is long. In such an area, as shown in FIG. 33, the refresh operation current approaches zero, a difference in power supply circuit current is equal to a difference in self-refresh current, and this means that as the data holding capacity is reduced and the refresh period is increased, the effect of application of the present invention becomes more significant.

Although the present invention has been explained concretely based on the first and second embodiments, the invention should not be limited to the embodiments, and various modifications can be made within a range not departing from a subject matter of the invention. For example, the storage capacity of the memory array 10 and the configuration of the circuit should not be limited to the above-described concrete examples, and the invention can widely be applied to various semiconductor memories. Concerning the setting contends, the number of switching stages, concrete setting methods and the like related to the holding area and the copy area, it is possible to employ modes suitable for the operation. The configuration of the power supply unit 60 and the control method by the power supply controller 72 are not limited to the example explained in the second embodiment, and various configurations and control methods can be employed.

The present invention is not limited to the above described embodiments, and various variations and modifications may be possible without departing from the scope of the present invention.

This application is based on the Japanese Patent applications No. 2004-307469 filed on Oct. 21, 2004 and No. 2004-328290 filed on Nov. 11, 2004 entire content of which is expressly incorporated by reference herein.

What is claimed is:

1. A refresh control method of a semiconductor memory device which controls a self-refresh operation to hold data in a memory array having a plurality of memory cells disposed at intersections of word lines corresponding to row addresses and bit lines corresponding to column addresses, comprising:

a step for dividing said memory array into a holding area used as a copy source which includes memory cells on a predetermined number of word lines, and a copy area used as a copy destination which includes memory cells on word lines to which entire data of said holding area is to be copied, a step for executing copy operation in which data of each memory cell of said holding area is copied to one or more memory cells in said copy area on the same bit line or the same pair of bit lines before executing said self-refresh operation, and a step for executing said self-refresh operation in which a row address of said holding area is designated and a corresponding word line is selected and driven, and at the same time, one or more word lines in said copy area corresponding to said selected word line are selected and driven.

2. A refresh control method of a semiconductor memory device according to claim 1, wherein in said copy operation, a row address of aid holding area is designated and a corresponding word line is selected and driven, and after a predetermined time is elapsed, one or more word lines in said copy area corresponding to said selected word line are selected and driven.

3. A refresh control method of a semiconductor memory device according to claim 1 or 2, wherein said holding area has a capacity which can be switched in a plurality of stages, and the number of memory cells of said copy destination corresponding to one bit of said copy source can be selectively changed in accordance with each said capacity.

4. A refresh control method of a semiconductor memory device according to claim 3, wherein said capacity of said holding area can be switched in M stages of $½^N$ (N is an integer of 1 or more and M or less) of the entire memory array, and data of one memory cell of said copy destination is copied to $2^N-1$ memory cells of said copy source.

5. A refresh control method of a semiconductor memory device according to claim 4, wherein said copy operation and said self-refresh operation, said holding area and plurality of said copy areas are discriminated based on M-bit predetermined pattern of a portion of said row address.

6. A refresh control method of a semiconductor memory device according to claim 1, wherein a first mode in which data only in said holding area is held and a second mode in which data in the entire memory array is held can be selectively set.

7. A refresh control method of a semiconductor memory device according to claim 1, further comprising:
a step in which when said self-refresh operation is suspended, whether an arbitrary word line is accessed for the first time or second or more time after exit of said self-refresh operation is discriminated, and
a step for simultaneously driving a word line to be accessed and one or more word lines in which the same data is held by said copy operation when said discrimination result shows an access for the first time, and driving only said word line to be accessed after shifting to a normal operation when said discrimination result shows an access for the second or more time.

8. A refresh control method of a semiconductor memory device according to claim 1, further comprising:
a step in which when said self-refresh operation is suspended, a row address of said holding area is designated and a corresponding word line is selected and driven, at the same time, one or more word lines in said copy area corresponding to said selected word line are selected and driven, and shifting to normal operation is performed after all of the word lines in said holding area and said copy area are driven.

9. A refresh control method of semiconductor memory device according to claim 1 or 2, further comprising:
a step for controlling switching of power supply of said semiconductor memory device such that supply voltages of said power supply are supplied or suspended in accordance with the state of said self-refresh operation.

10. A refresh control method of a semiconductor memory device according to claim 9, wherein said power supply includes an array power supply for an array circuit and a peripheral power supply for a peripheral circuit,
and switching of said peripheral power supply is controlled such that supply of at least one voltage to a portion of said peripheral circuit is suspended during said self-refresh operation, and switching of said array power supply is controlled such that power-down or power-up of at least one voltage to said array circuit is repeatedly performed in a predetermined period during said self-refresh operation.

11. A refresh control method of a semiconductor memory device according to claim 10, wherein in said self-refresh, burst refresh for controlling such that all of the word lines in said holding area are collectively selected at predetermined timing during a refresh period is executed, and switching of said array power supply is controlled such that said power-up is performed during an operation period of said burst refresh and said power-down is performed during suspension period of said burst refresh.

12. A refresh control method of a semiconductor memory device according to any one of claim 9, wherein said holding area has a capacity which can be switched in a plurality of stages, and the number of memory cells of said copy destination corresponding to one bit of said copy source can be selectively changed in accordance with each said capacity.

13. A refresh control method of a semiconductor memory device according to claim 12, wherein switching control of said power supply is performed when said capacity of said holding area which is set to any of said plurality of stages is not greater than a preset capacity, and switching control of said power supply is not performed when said capacity of said holding area is set to any of other stage.

14. A refresh control method of a semiconductor memory device according to claim 9, wherein the presence or the absence of said power supply control can selectively be set, and in said self-refresh, switching control of said power supply is performed when the presence of said power supply control is set, and said switching control of said power supply is not performed when the absence of said power supply control is set.

15. A semiconductor memory device comprising:
a memory array having a plurality of memory cells disposed at intersections of word lines corresponding to row addresses and bit lines corresponding to column addresses,
self-refresh control means for controlling a self-refresh operation in which said memory array is divided into a holding area used as a copy source which includes memory cells on a predetermined number of word lines and a copy area used as a copy destination which includes memory cells on word lines to which entire data of said holding area is to be copied, and a row address of said holding area is designated sequentially to hold data in said self-refresh operation,
word line selecting and driving means for selecting and driving a word line in said holding area designated by said self-refresh control means, and for selecting and driving one or more word lines in said copy area corresponding to said selected word line after a predetermined time is elapsed.

16. A semiconductor memory device according to claim 15, further comprising a setting register capable of selectively switching a plurality of stages as a capacity of said holding area, wherein the number of memory cells of said copy destination corresponding to one bit of said copy source is discriminated in accordance with contents of said setting register.

17. A semiconductor memory device according to claim 16, wherein a first mode in which data only in said holding area is held and a second mode in which data in the entire memory array is held can be selectively set in said setting register.

18. A semiconductor memory device according to any one of claims 15 to 17, wherein said capacity of said holding area can be switched in M stages of $\frac{1}{2^N}$ (N is an integer of 1 or more and M or less) of the entire memory array, and said word line selecting and driving means selects and drives a plurality of memory cells of said copy destination corresponding to different M bit patters of a portion of said row address.

19. A semiconductor memory device according to claim 15, further comprising discriminating means in which when said self-refresh operation is suspended, whether an arbitrary word line is accessed for the first time or second or more time after exit of said self-refresh operating is discriminated,
wherein said word line selecting and driving means simultaneously drives a word line to be accessed and one or more word lines in which the same data is held by said copy operation when said discrimination result shows an access for the first time, and drives only said word line to be accessed after shifting to a normal operation when said discrimination result shows an access for the second or more time.

20. A semiconductor memory device according to claim 15, wherein said memory array is divided into a plurality of blocks, in each of which word lines and bit lines are common, and said holding area and said copy area consist of a combination of said blocks.

21. A semiconductor memory device according to claim 15, wherein said memory cell is connected to one or the other of a pair of bit lines connected to a common sense amplifier, and the same number of memory cells among memory cells of said copy source and said copy destination on the same pair of bit lines are connected to one and the other of said pair of bit lines.

22. A semiconductor memory device comprising:
- an array circuit having a plurality of memory cells disposed at intersections of word lines corresponding to row addresses and bit lines corresponding to column addresses,
- a peripheral circuit including control means for controlling operation of said array circuit,
- voltage generating means for generating at least one array voltage of an array power supply to be supplied to said array circuit and at least one peripheral voltage of a peripheral power supply to be supplied to said peripheral circuit,
- self-refresh control means for controlling a self-refresh operation in which said memory array is divided into a holding area used as a copy source which includes memory cells on a predetermined number of word lines and a copy area used as a copy destination which includes memory cells on word lines to which entire data of said holding area is to be copied, copy operation in which data of each memory cell of said holding area is copied to one or more memory cells in said copy area on the same bit line or the same pair of bit lines is executed, and said self-refresh operation in which a row address of said holding area is designated and a corresponding word line is selected and driven, and at the same time, one or more word lines in said copy area corresponding to said selected word line are selected and driven is executed, and
- power supply control means for controlling switching of said array power supply and said peripheral power supply such that supply or suspension of said array voltage and said peripheral voltage is switched in accordance with a state of said self-refresh operation.

23. A semiconductor memory device according to claim 22, wherein said self-refresh control means designates a row address of said holding area, selects and drive a corresponding word line, and selects and drives one or more word lines in said copy area corresponding to said selected word line after a predetermined time is elapsed.

24. A semiconductor device according to claim 22 or 23, wherein said power supply control means controls switching such that supply of said at least one peripheral voltage to a portion of said peripheral circuit is suspended during said self-refresh operation, and power-down or power-up of said at least one array voltage to said array circuit is repeatedly performed in a predetermined period during said self-refresh operation.

25. A semiconductor memory device according to claim 24, wherein said self-refresh control means executes burst refresh in which all of the word lines in said holding area are collectively selected at predetermined timing during a refresh period, and said power supply control means controls such that supply of said array voltage is performed during an operation period of said burst refresh and suspension of said array voltage during suspension period of said burst refresh.

26. A semiconductor memory device according to any one of claim 23, further comprising a setting register capable of selectively switching a plurality of stages as a capacity of said holding area, wherein the number of memory cells of said copy destination corresponding to one bit of said copy source is discriminated in accordance with contents of said setting register.

27. A semiconductor memory device according to claim 26, wherein said power supply control means controls switching of said power supply when said capacity of said holding area is set to stages which are equal to or lower than preset capacity, and does not controls switching of said power supply when said capacity of said holding area is set to other stages.

28. A semiconductor memory device according to claim 26, wherein the presence or absence of control of said power supply control means can be selectively set in said setting register, and when said self-refresh is executed, the presence or absence of control of said power supply control means is selected in accordance with contents of said setting register.

* * * * *